(12) United States Patent
Park

(10) Patent No.: US 11,647,664 B2
(45) Date of Patent: May 9, 2023

(54) METHOD OF MANUFACTURING DISPLAY APPARATUS

(71) Applicant: Samsung Display Co., Ltd., Yongin-si (KR)

(72) Inventor: Daehum Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 147 days.

(21) Appl. No.: 17/129,139

(22) Filed: Dec. 21, 2020

(65) Prior Publication Data

US 2021/0313547 A1 Oct. 7, 2021

(30) Foreign Application Priority Data

Apr. 7, 2020 (KR) .......................... 10-2020-0042404

(51) Int. Cl.
| | |
|---|---|
| *H01L 51/56* | (2006.01) |
| *H01L 21/67* | (2006.01) |
| *H01L 21/687* | (2006.01) |
| *C23C 16/04* | (2006.01) |
| *C23C 16/458* | (2006.01) |
| *H01L 21/78* | (2006.01) |

(Continued)

(52) U.S. Cl.
CPC ............ *H01L 51/56* (2013.01); *C23C 16/042* (2013.01); *C23C 16/4586* (2013.01); *H01L 21/68742* (2013.01); *H01L 21/68778* (2013.01); *H01L 21/68785* (2013.01); *H01L 21/78* (2013.01); *H01L 27/1259* (2013.01); *H01L 27/323* (2013.01); *H01L 27/3244* (2013.01); *H01L 51/0011* (2013.01); *H01L 2227/323* (2013.01); *H01L 2251/566* (2013.01)

(58) Field of Classification Search
CPC ..... H01L 21/68; H01L 21/681; H01L 21/682; H01L 21/68771; H01L 21/0262; H01L 21/78

See application file for complete search history.

(56) References Cited

U.S. PATENT DOCUMENTS

| | | | |
|---|---|---|---|
| 5,625,526 A | * | 4/1997 | Watanabe ........... G03F 7/70708 |
| | | | 361/234 |
| 6,198,074 B1 | * | 3/2001 | Savas ...................... C23C 16/46 |
| | | | 219/390 |

(Continued)

FOREIGN PATENT DOCUMENTS

| | | | | |
|---|---|---|---|---|
| CN | 1838387 A | * | 9/2006 | ............... H04B 1/40 |
| KR | 10-2007-0046720 | * | 5/2007 | ........... G02F 1/1303 |

(Continued)

OTHER PUBLICATIONS

Machine translation, Masaru, Chinese Pat. Pub. No. CN-1838387-A, translation date: Jul. 12, 2022, Espacenet, all pages. (Year: 2022).*

(Continued)

*Primary Examiner* — Victoria K. Hall
(74) *Attorney, Agent, or Firm* — Kile Park Reed & Houtteman PLLC

(57) ABSTRACT

A method of manufacturing a display apparatus includes placing a display substrate on a susceptor in a chamber, maintaining the susceptor at a first temperature, dividing the display substrate into a plurality of partial substrates, and maintaining the susceptor at a second temperature.

20 Claims, 18 Drawing Sheets

(51) Int. Cl.
*H01L 27/12* (2006.01)
*H01L 27/32* (2006.01)
*H01L 51/00* (2006.01)

(56) References Cited

U.S. PATENT DOCUMENTS

| | | | | |
|---|---|---|---|---|
| 6,599,367 | B1* | 7/2003 | Nakatsuka | C23C 16/45565 118/728 |
| 7,687,300 | B2* | 3/2010 | Chae | C23C 16/24 438/57 |
| 8,950,469 | B2 | 2/2015 | Sasaki et al. | |
| 10,941,490 | B2* | 3/2021 | Shugrue | C23C 16/4586 |
| 2003/0026904 | A1* | 2/2003 | Yadav | H01L 21/6838 269/21 |
| 2003/0109134 | A1* | 6/2003 | Yuzuriha | H01L 21/67757 257/E21.507 |
| 2003/0141017 | A1* | 7/2003 | Fujisato | C23C 4/04 156/345.47 |
| 2003/0164226 | A1* | 9/2003 | Kanno | H01L 21/67109 438/758 |
| 2003/0200928 | A1* | 10/2003 | Tanaka | C23C 16/042 118/720 |
| 2004/0163762 | A1* | 8/2004 | Iizuka | H01J 37/32706 156/345.39 |
| 2005/0000449 | A1* | 1/2005 | Ishibashi | C23C 16/4585 118/728 |
| 2006/0011137 | A1* | 1/2006 | Keller | C23C 16/042 118/720 |
| 2006/0060141 | A1* | 3/2006 | Kamaishi | H01L 21/67069 156/345.33 |
| 2006/0163202 | A1* | 7/2006 | Shimizu | H01L 21/3086 257/E21.235 |
| 2006/0207508 | A1* | 9/2006 | Leung | H01L 21/68778 118/728 |
| 2006/0292876 | A1* | 12/2006 | Naito | H01L 21/0337 700/121 |
| 2007/0009649 | A1* | 1/2007 | Nakamura | H01J 37/32082 118/724 |
| 2007/0259535 | A1* | 11/2007 | Washington | C30B 29/403 257/E21.108 |
| 2010/0326957 | A1* | 12/2010 | Maeda | H01J 37/20 156/345.26 |
| 2011/0083837 | A1* | 4/2011 | Sasaki | H01L 21/67248 165/104.14 |
| 2013/0045548 | A1* | 2/2013 | Kappeler | H01L 21/67253 118/712 |
| 2013/0045604 | A1* | 2/2013 | Maeda | H01J 37/32146 156/345.28 |
| 2013/0263782 | A1* | 10/2013 | Wang | C23C 16/042 118/720 |
| 2014/0109940 | A1* | 4/2014 | Ohashi | H01J 37/32862 134/37 |
| 2014/0231019 | A1* | 8/2014 | Kajihara | H01L 21/67103 118/723 R |
| 2014/0311728 | A1* | 10/2014 | Nonaka | H01L 21/67103 165/104.31 |
| 2015/0380561 | A1* | 12/2015 | Won | H01L 21/02554 257/43 |
| 2016/0097123 | A1* | 4/2016 | Shugrue | C23C 16/4581 118/500 |
| 2017/0081757 | A1* | 3/2017 | Kurita | C23C 16/5096 |
| 2017/0275759 | A1* | 9/2017 | Kurita | H01J 37/32357 |
| 2018/0047645 | A1* | 2/2018 | Varadarajan | C23C 16/46 |
| 2019/0221432 | A1* | 7/2019 | Adachi | C23C 16/4404 |
| 2020/0013593 | A1* | 1/2020 | Washio | H01J 37/32669 |
| 2021/0143044 | A1* | 5/2021 | Oka | H01L 21/68721 |
| 2021/0156030 | A1* | 5/2021 | Shugrue | C23C 16/46 |
| 2021/0175049 | A1* | 6/2021 | Hama | H01J 37/3244 |
| 2022/0157576 | A1* | 5/2022 | Iwase | H01L 21/3065 |
| 2022/0341040 | A1* | 10/2022 | Kawahara | C23C 16/4583 |

FOREIGN PATENT DOCUMENTS

| | | | | |
|---|---|---|---|---|
| KR | 10-2009-0109337 | * | 10/2009 | ....... H01L 21/02274 |
| KR | 10-2013-0010537 | * | 1/2013 | ............ C23C 16/18 |
| KR | 10-1267397 | | 6/2013 | |
| KR | 10-2013-0099794 | * | 9/2013 | ............ C04B 35/52 |
| KR | 10-2013-0129550 | * | 11/2013 | ......... C23C 16/4583 |
| KR | 10-1395288 | | 5/2014 | |
| KR | 10-2014-0085948 | * | 7/2014 | ......... H01L 21/6708 |
| KR | 10-1672859 | | 11/2016 | |

OTHER PUBLICATIONS

Machine translation, Kang, Korean Pat. Pub. No. KR10-2014-0085948, translation date: Jul. 11, 2022, Espacenet, all pages. (Year: 2022).*

Machine translation, Lim, Korean Pat. Pub. No. KR10-2007-0046720, translation date: Jul. 9, 2022, Espacenet, all pages. (Year: 2022).*

Machine translation, Seo, Korean Pat. Pub. No. KR10-2013-0010537, translation date: Jul. 9, 2022, Espacenet, all pages. (Year: 2022).*

Machine translation, Yun, Korean Pat. Pub. No. KR10-2013-0129550, translation date: Jul. 9, 2022, Espacenet, all pages. (Year: 2022).*

Machine translation, Shim, Korean Pat. Pub. No. KR10-2009-0109337, translation date: Jul. 11, 2022, Espacenet, all pages. (Year: 2022).*

Machine translation, Shin, Korean Pat. Pub. No. KR10-2013-0099794, translation date: Jul. 9, 2022, Espacenet, all pages. (Year: 2022).*

* cited by examiner

METHOD OF MANUFACTURING DISPLAY APPARATUS

CROSS-REFERENCE TO RELATED APPLICATION(S)

This application claims priority to and benefits of Korean Patent Application No. 10-2020-0042404 under 35 U.S.C. § 119, filed in the Korean Intellectual Property Office on Apr. 7, 2020, the entire contents of which are incorporated herein by reference.

BACKGROUND

1. Technical Field

One or more embodiments relate to a method of manufacturing a display apparatus by using a susceptor.

2. Description of the Related Art

Recently, uses of display apparatuses have been diversified. Furthermore, as the thickness and weight of a display apparatus decrease, a range of use of the display apparatus is increasing.

As the size of a display area for displaying an image in a display apparatus increases, various functions combined with or associated with the display apparatus have been added. As a method of adding various functions while increasing an area, a display apparatus having a display area not only displaying an image but also having various additional functions has been continuously researched.

Such a display apparatus may include, on a substrate, various layers such as a pixel circuit layer including a thin film transistor, a display layer having a display component, and an input sensing portion for sensing a touch input. The reliability of the display apparatus may be increased by uniformly forming various layers on the entire surface of the substrate. To uniformly form the various layers on the entire surface of the substrate, it may be important that the display apparatus is maintained at a uniform temperature during manufacturing. To this end, during a manufacturing process, a display apparatus may be placed on a susceptor for maintaining a uniform temperature, and the various layers may be formed on the substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may provide methods of manufacturing a display apparatus by using a susceptor that satisfies various process conditions.

Additional aspects will be set forth in part in the description which follows and, in part, will be apparent from the description, or may be learned by practice of the presented embodiments of the disclosure.

According to one embodiment, a method of manufacturing a display apparatus may include placing a display substrate on a susceptor in a chamber, maintaining the susceptor at a first temperature, dividing the display substrate into a plurality of partial substrates, placing the plurality of partial substrates on the susceptor, and maintaining the susceptor at a second temperature.

In one embodiment, the method may further include arranging a first mask frame in the chamber, the first mask frame including a first opening, wherein the first mask frame may overlap an edge of the display substrate, and the first opening may expose a central area of the display substrate.

In one embodiment, the method may further include forming a pixel circuit layer on the display substrate.

In one embodiment, the susceptor may include a heater that maintains the susceptor at the first temperature.

In one embodiment, the method may further include arranging a second mask frame in the chamber, the second mask frame including a plurality of second openings, wherein the second mask frame may overlap edges of the plurality of partial substrates, and the plurality of second openings respectively may expose central areas of the plurality of partial substrates.

In one embodiment, the maintaining of the susceptor at the second temperature may include introducing a coolant in the susceptor through a coolant input portion of the susceptor, and discharging the coolant from the susceptor through a coolant output portion of the susceptor.

In one embodiment, the method may further include forming an input sensing portion on each of the plurality of partial substrates.

In one embodiment, the first temperature may be higher than the second temperature.

In one embodiment, the susceptor may include a plurality of holes, and a support plate that supports the display substrate or the plurality of partial substrates, the plurality of holes of the susceptor may be formed in a first region and in a second region surrounded by the first region, and the first region may be an edge of the support plate.

In one embodiment, the placing of the plurality of partial substrates on the susceptor may include placing the plurality of partial substrates on support pins that respectively pass through the plurality of holes, and placing the plurality of partial substrates on the support plate by moving either of the support pins and the susceptor with respect to the other of the support pins and the susceptor.

In one embodiment, the method may further include moving the susceptor upwards.

In one embodiment, the method may further include preventing deformation of the susceptor by using a deformation prevention part, wherein the susceptor includes the deformation part.

According to another embodiment, a method of manufacturing a display apparatus may include placing a substrate on a susceptor which includes a flow path and a heater, operating the heater, circulating a coolant through the flow path, forming layers on the substrate by spraying a deposition material through a spray portion, forming a first layer on the substrate in conjunction with the operating of the heater, and forming a second layer on the substrate in conjunction with the circulating of the coolant through the flow path.

In one embodiment, the forming of the first layer may include forming a pixel circuit layer on the substrate in conjunction with the operating of the heater.

In one embodiment, the method may further include maintaining the susceptor at a first temperature by using the heater.

In one embodiment, the forming of the second layer may include forming an input sensing portion on the substrate in conjunction with the circulating of the coolant.

In one embodiment, the method may further include maintaining the susceptor at a second temperature by circulating the coolant through the flow path.

In one embodiment, the susceptor may include a support plate that supports the substrate and may include a plurality of holes, and the plurality of holes may be disposed in a first region and in a second region surrounded by the first region, wherein the first region may be an edge of the support plate.

In one embodiment, the method may further include arranging a mask frame including at least one opening in a chamber to face the susceptor, moving the susceptor upwards, and arranging the mask frame to overlap an edge of the substrate.

In one embodiment, the susceptor may include a body part and a deformation prevention part, the body part surrounding the flow path and the heater, and the deformation prevention part may prevent deformation of the body part.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
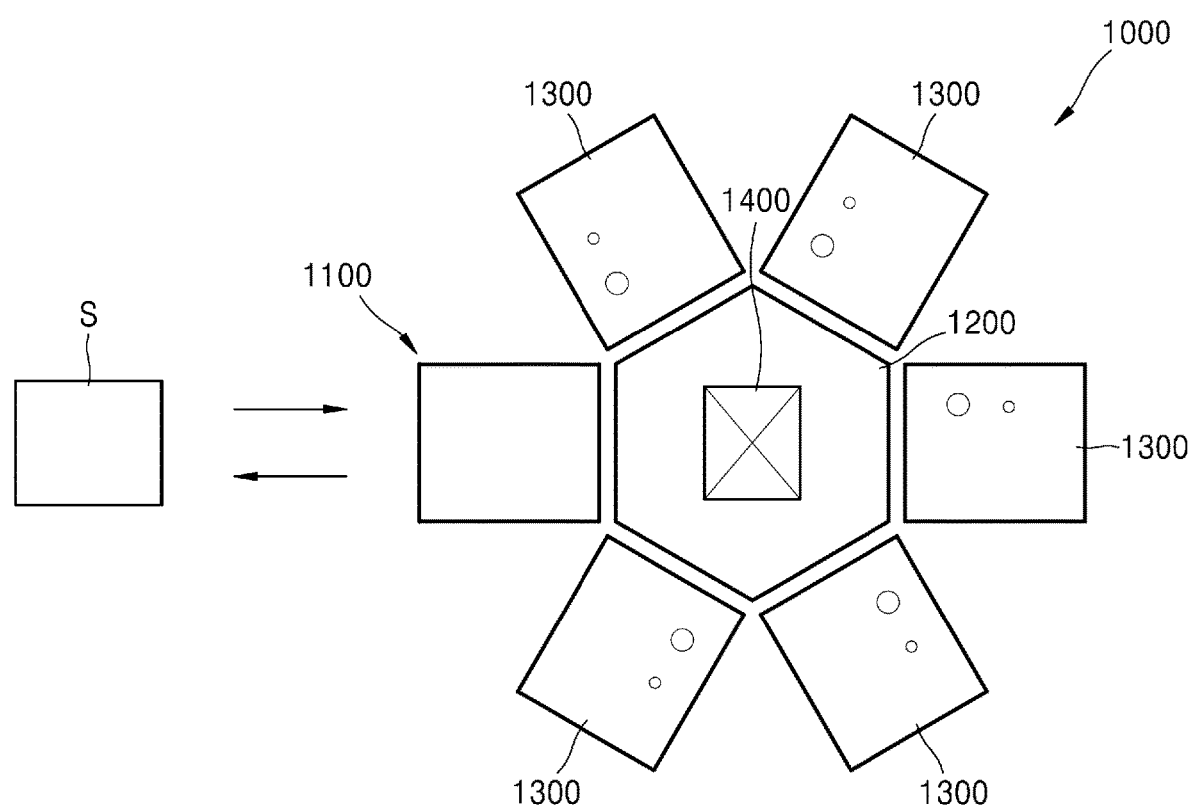
FIG. 1 is a schematic plan view of an apparatus for manufacturing a display apparatus according to an embodiment.

Reference will now be made in detail to embodiments, examples of which are illustrated in the accompanying drawings. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b and c" indicates only a, only b, only c, both a and b, both b and c, both a and c, all of a, b, and c, or variations thereof.

Various modifications may be applied to the embodiments, and particular embodiments will be illustrated in the drawings and described. The effect and features of the embodiments, and a method to achieve the same, will be clearer referring to the detailed descriptions below with the drawings. However, the embodiments may be implemented in various forms, and are not limited to the embodiments presented below.

Hereinafter, the disclosure will be described in detail by explaining embodiments of the disclosure with reference to the attached drawings. Like reference numerals in the drawings denote like elements, and redundant explanations are omitted.

In the embodiments below, it will be understood that although the terms "first," "second," etc. may be used herein to describe various components, these components should not be limited by these terms. These terms are only used to distinguish one component from another.

In the embodiments below, the singular forms "a," "an" and "the" are intended to include the plural forms as well, unless the context clearly indicates otherwise.

In the embodiments below, it will be further understood that terms such as "comprises", "have", and "includes" specify the presence of stated features or components, but do not preclude the presence or addition of one or more other features or components.

In the embodiments below, it will be understood that when a layer, region, or component is referred to as being "formed on" another layer, region, or component, it can be directly or indirectly formed on the other layer, region, or component. For example, intervening layers, regions, or components may be present.

Sizes of components in the drawings may be exaggerated for convenience of explanation. For example, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, It will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

The term "overlap" may include layer, stack, face or facing, extending over, extending under, covering or partly covering or any other suitable term as would be appreciated and understood by those of ordinary skill in the art.

"About" or "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Figure 2:
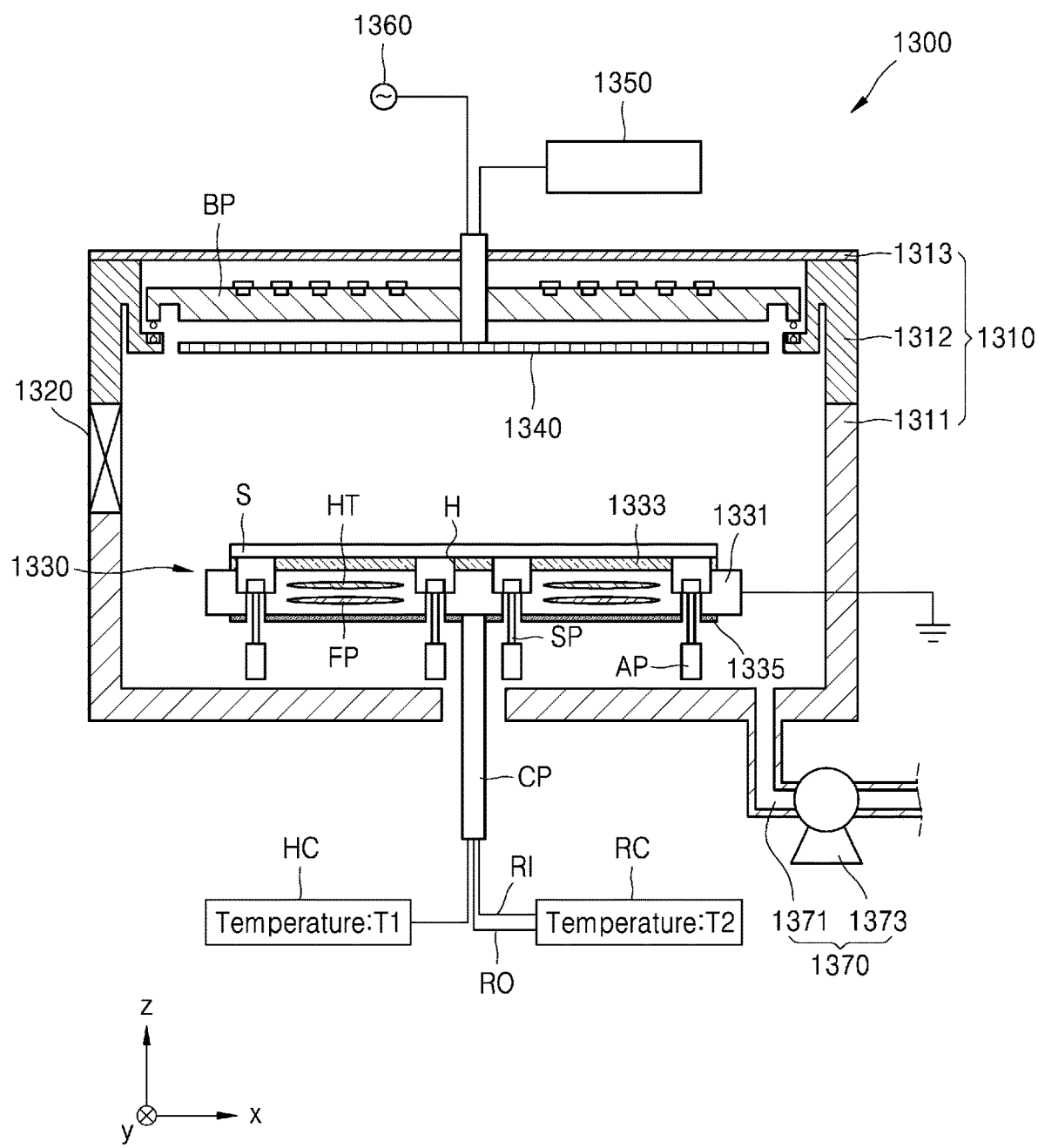
FIG. 2 is a schematic cross-sectional view of a processing portion according to an embodiment.

FIG. 1 is a schematic plan view of an apparatus 1000 for manufacturing a display apparatus according to an embodiment. FIG. 2 is a schematic cross-sectional view of a processing portion 1300 according to an embodiment.

Referring to FIG. 1, the apparatus 1000 for manufacturing a display apparatus may include a loading portion 1100, a transfer portion 1200, and a processing portion 1300.

The loading portion 1100 may be extended to the transfer portion 1200. The loading portion 1100 functions as an entrance of the apparatus 1000 for manufacturing a display apparatus, and a display substrate S may be loaded in the loading portion 1100 from the outside. The display substrate S may be transferred to the transfer portion 1200 via the loading portion 1100.

The pressure in the loading portion 1100 may be adjusted to be the same as or similarly to the atmospheric pressure. As another example, the internal pressure of the loading portion 1100 may be adjusted to be the same as or similar to a vacuum state. For example, in case that the display substrate S is externally loaded, the pressure of the loading portion 1100 may be adjusted the same as or similar to the atmospheric pressure. Furthermore, in case that the display substrate S is transferred to the transfer portion 1200, the pressure of the loading portion 1100 may be adjusted to be the same as or similar to the vacuum state.

The transfer portion 1200 may be extended to the loading portion 1100 and the processing portion 1300. The transfer portion 1200 may receive or take over the display substrate S from the processing portion 1300 or the loading portion 1100. In this state, the transfer portion 1200 may include a robot arm 1400. The robot arm 1400 may transfer the display substrate S from the loading portion 1100 to the transfer portion 1200. Furthermore, the robot arm 1400 may transfer the display substrate S from the transfer portion 1200 to the processing portion 1300, or the display substrate S having undergone a process from the processing portion 1300 to the transfer portion 1200.

The processing portion 1300 may be extended to the transfer portion 1200. In one embodiment, the processing portion 1300 may include a plurality of processing portions. In this state, the processing portions 1300 each may be extended to the transfer portion 1200. Although FIG. 1 illustrates that five processing portions 1300 each are extended to the transfer portion 1200, the number of the processing portions 1300 may be variously changed.

A process of manufacturing a display apparatus may be performed in the processing portion 1300. For example, chemical vapor deposition (CVD) may be performed in the processing portion 1300. In another example, plasma CVD or plasma enhanced CVD (PECVD) may be performed in the processing portion 1300. In another example, atomic layer deposition (ALD) or plasma enhanced ALD (PEALD) may be performed in the processing portion 1300.

The display substrate S may be a display apparatus being manufactured. The display substrate S may include glass or polymer resin such as polyethersulfone, polyarylate, polyetherimide, polyethylene naphthalate, polyethylene terephthalate, polyphenylene sulfide, polyimide, polycarbonate (PC), cellulose triacetate (TAC), cellulose acetate propionate, or a combination thereof.

In one embodiment, the display substrate S may be a mother substrate that is a set of cell areas. In this state, each of cell areas may be a part of a display apparatus being manufactured. The display substrate S may be divided by a cutting process. In one embodiment, the display substrate S may be divided into a plurality of partial substrates. For example, a partial substrate may be a bisected substrate of the display substrate S. As another example, the display substrate S may be divided according to the cell areas. In some embodiments, the entire display substrate S may be a part of a display apparatus that undergoes a manufacturing process.

In one embodiment, the display substrate S may be laser cut by using a laser apparatus. In another embodiment, the display substrate S may be cut by using a knife.

Referring to FIG. 2, the processing portion 1300 may include a chamber 1310, an opening/closing portion 1320, a susceptor 1330, a spray portion 1340, a deposition material supply portion 1350, a power portion 1360, a pressure adjustment portion 1370, a support pin SP, a support pin adjustment portion AP, a heater control portion HC, and a coolant control portion RC.

The chamber 1310 may have a space formed therein, and have one open side so that the display substrate S may be withdrawn or received therethrough. In one embodiment, the opening/closing portion 1320 having a gate valve may be disposed at the open side of the chamber 1310 so as to be selectively opened/closed. In case that the opening/closing portion 1320 is open, the robot arm 1400 may load the display substrate S into the chamber 1310.

In one embodiment, the chamber 1310 may be a chamber for CVD or PECVD. In another embodiment, the chamber 1310 may be a chamber for ALD or PEALD. In another embodiment, the chamber 1310 may be a chamber in which CVD (or PECVD) or ALD (or PEALD) is selectively performed. In the following description, a case in which the chamber 1310 may be a chamber for PECVD is described in detail.

The chamber 1310 may include a first part 1311, a second part 1312, and a third part 1313. The first part 1311 may correspond to a chamber body. The second part 1312 may be disposed above the first part 1311. The second part 1312 may correspond to a lid. The third part 1313 may correspond to a cover plate. The third part 1313 may be disposed covering a backing plate BP. In this state, the backing plate BP may protect the inside of the chamber 1310 from the atmospheric environment and prevent leakage of a deposition material sprayed from the spray portion 1340. In one embodiment, the backing plate BP may be provided with a plurality of coolant flow paths.

The display substrate S may be placed on the susceptor 1330 disposed in the chamber 1310. As another example, the display substrate S may be placed on the susceptor 1330 by being divided into a plurality of partial substrates. The display substrate S or the partial substrates may be placed on the susceptor 1330 by the support pin SP and the support pin adjustment portion AP.

The susceptor 1330 may include a flow path FP, through which a coolant circulates, and a heater HT. Accordingly, the susceptor 1330 may adjust the temperature of the display substrate S. For example, the susceptor 1330 may be maintained at a first temperature T1 that is preset. The first temperature T1 may be about 150° C. or greater and about 400° C. or less. In this state, the heater HT may maintain the susceptor 1330 at the first temperature T1 that is preset. The heater HT may be electrically connected to the heater control portion HC.

The susceptor 1330 may be maintained at a second temperature T2 that is preset. The second temperature T2 may be about 150° C. or less. Accordingly, the first temperature T1 may be higher than the second temperature T2. In this state, as the coolant circulates through the flow path FP, the susceptor 1330 may be maintained at the second temperature T2 that is preset. The flow path FP may be extended to a coolant input portion RI or a coolant output portion RO, and the coolant input portion RI and the coolant output portion RO may be extended to the coolant control portion RC.

The susceptor 1330 may include a body part 1331, a support plate 1333, a deformation prevention part 1335, and a center part CP. The body part 1331 may surround the heater HT and the flow path FP. In other words, the heater HT and the flow path FP may be inserted into the body part 1331. In one embodiment, the heater HT may be disposed above the flow path FP. In another embodiment, the heater HT may be disposed under the flow path FP. In the following description, a case in which the heater HT may be disposed above the flow path FP is described in detail.

The support plate 1333 may be disposed above the body part 1331. In this state, the display substrate S may be placed on the support plate 1333. In one embodiment, the support plate 1333 may be integrally provided with the body part 1331. The support plate 1333 may be a portion protruding from the body part 1331 in a z direction.

The support plate 1333 may include a hole H through which the support pin SP passes. The hole H may include a plurality of holes, and the support pin SP may include a plurality of support pins SP. The holes H may be disposed along an edge of the support plate 1333, and also in a central area of the support plate 1333.

The body part 1331 and/or the support plate 1333 may include at least one of aluminum (Al), magnesium (Mg), zinc (Zn), manganese (Mn), copper (Cu), and silicon (Si). For example, the body part 1331 and/or the support plate 1333 may include an alloy of Al—Mg—Si. In another example, the body part 1331 and/or the support plate 1333 may include an alloy of Al—Zn—Mg.

The deformation prevention part 1335 may be disposed under the body part 1331. The deformation prevention part 1335 may be a plate supporting the body part 1331. The deformation prevention part 1335 may prevent deformation of the body part 1331. For example, in case that the body part 1331 is heated by the heater HT to the first temperature T1, the body part 1331 may be thermally deformed. In this state, as the deformation prevention part 1335 supports the body part 1331, the body part 1331 may be prevented from being deformed by heat and sagged. The deformation prevention part 1335 may include a ceramic material. For example, the deformation prevention part 1335 may include at least one of Si, Al, titanium (Ti), and zirconium (Zr).

The body part 1331 and the deformation prevention part 1335 each may include a through-hole corresponding to the hole H of the support plate 1333. The through-hole may include a plurality of through-holes that are extended to each of the holes H of the support plate 1333. Accordingly, the support pins SP may penetrate the susceptor 1330 and support the display substrate S.

The center part CP may be disposed under the body part 1331. The center part CP may adjust the location of the body part 1331. Accordingly, the susceptor 1330 may ascend or descend. For example, the center part CP may include a cylinder. In another example, the center part CP may include a linear motor. In another example, the center part CP may include a rack and pinion. The center part CP may include all apparatuses and all structures for adjusting the location of the body part 1331.

Heater lines of the heater HT may pass through the inside of the center part CP and may be electrically connected to the heater control portion HC. Furthermore, the coolant input portion RI and the coolant output portion RO extended to the flow path FP may pass through the inside of the center part CP to be extended to the coolant control portion RC.

The heater control portion HC may be electrically connected to the heater HT to control the temperature of the heater HT. For example, the heater control portion HC may control the heater HT to have the first temperature T1. In this state, the first temperature T1 may be about 150° C. or greater about 400° C. or less. In case that the heater control portion HC controls the temperature of the heater HT, a pixel circuit layer including a thin film transistor may be formed on the display substrate S.

The coolant control portion RC may be extended to the flow path FP to control temperature of the coolant. The coolant control portion RC may supply the coolant to the flow path FP through the coolant input portion RI. Furthermore, the coolant control portion RC may receive, through the coolant output portion RO, the coolant having circulated through the flow path FP. The coolant control portion RC may control the coolant circulating through the flow path FP to have the second temperature T2. In this state, the second temperature T2 may be about 150° C. or less. The coolant may include perfluoropolyether (PFPE). For example, the coolant may be a Galden fluid. In case that the coolant control portion RC supplies the coolant through the flow path FP, an input sensing portion may be formed on the display substrate S.

In the embodiment, the susceptor 1330 may include the heater HT and the flow path FP through which the coolant circulates. Accordingly, the susceptor 1330 may satisfy various process conditions. For example, the pixel circuit layer including a thin film transistor in the display apparatus may be formed in a range of about 150° C. or greater and about 400° C. or less, and the input sensing portion may be formed at about 150° C. or less. Unlike the embodiment, a first susceptor may include the heater HT, and the second susceptor may include the flow path FP through which the coolant circulates. After the display substrate S is placed on the first susceptor, the pixel circuit layer may be formed. After the display substrate S is placed on the second susceptor, the input sensing portion may be formed. In other words, the first susceptor needs to be replaced with the second susceptor. As the susceptor 1330 of the embodiment includes both the heater HT and the flow path FP through which the coolant circulates, various process conditions may be satisfied, and the efficiency of the apparatus 1000 for manufacturing a display apparatus may be increased.

The support pin SP may be disposed to pass through the holes H of the support plate 1333. In one embodiment, the support pin SP may have a T shape. In another embodiment, the support pin SP may have a shape extending in one direction. For example, the support pin SP may have a shape extending in the z direction. In the following description, a case in which the support pin SP has a T shape is described in detail.

The display substrate S transferred by the robot arm 1400 may be placed on the support pin SP, and one of the support pin SP and the susceptor 1330 moves relative to another of the support pin SP and the susceptor 1330 so that the display substrate S may be placed on the susceptor 1330. In one embodiment, the support pin SP may be extended to the support pin adjustment portion AP so as to ascend or descend. In another embodiment, the support pin SP may be fixed in the chamber 1310. For example, the support pin SP may be fixed to an inner side wall of the first part 1311. In the following description, a case in which the support pin SP ascends or descends by being extended to the support pin adjustment portion AP is described in detail.

The support pin adjustment portion AP may adjust the location of the support pin SP. The support pin adjustment portion AP may move the support pin SP upwards or downwards. For example, the support pin adjustment portion AP may include a cylinder. In another example, the support pin adjustment portion AP may include a linear motor. In another example, the support pin adjustment portion AP may include a rack and pinion. The support pin adjustment portion AP may include all apparatuses and all structures for adjusting the location of the support pin SP.

The spray portion 1340 may supply a deposition material to the inside of the chamber 1310. The spray portion 1340 may include a plurality of nozzles, and the deposition material may be sprayed toward the inside of the chamber 1310 through the nozzles. The deposition material may be a gas containing a component that becomes a raw material of a layer to be formed on the display substrate S. In one embodiment, the spray portion 1340 may function as one of two electrodes for forming plasma with the susceptor 1330. For example, the spray portion 1340 may be electrically connected to the power portion 1360. The susceptor 1330 may be grounded.

The deposition material supply portion 1350 may supply the deposition material to the spray portion 1340. Furthermore, the deposition material supply portion 1350 may store the deposition material.

The power portion 1360 may be electrically connected to the spray portion 1340. In one embodiment, the power portion 1360 may supply alternating current (AC) power to the spray portion 1340. The spray portion 1340 may function as an upper electrode, and the susceptor 1330 may function as a lower electrode. Accordingly, plasma may be formed between the spray portion 1340 and the susceptor 1330.

The pressure adjustment portion 1370 may include a connection pipe 1371 extended to the chamber 1310 and a pump 1373 provided on the connection pipe 1371. In this state, external air may be introduced through the connection pipe 1371, or the gas in the chamber 1310 may be discharged to the outside through the connection pipe 1371 according to the operation of the pump 1373.

The processing portion 1300 may further include a mask frame. In this state, the mask frame may be disposed between the susceptor 1330 and the spray portion 1340. In one embodiment, the mask frame may be fixed inside the chamber 1310. The mask frame may shield an edge of the display substrate S. Accordingly, the mask frame may prevent the deposition material sprayed from the spray portion 1340 from being deposited on the edge of the display substrate S. The mask frame may include a first mask frame and a second mask frame.

The first mask frame may shield the edge of the display substrate S. In case that the display substrate S is divided into a plurality of partial substrates, the second mask frame may shield edges of the partial substrates.

Figure 3:
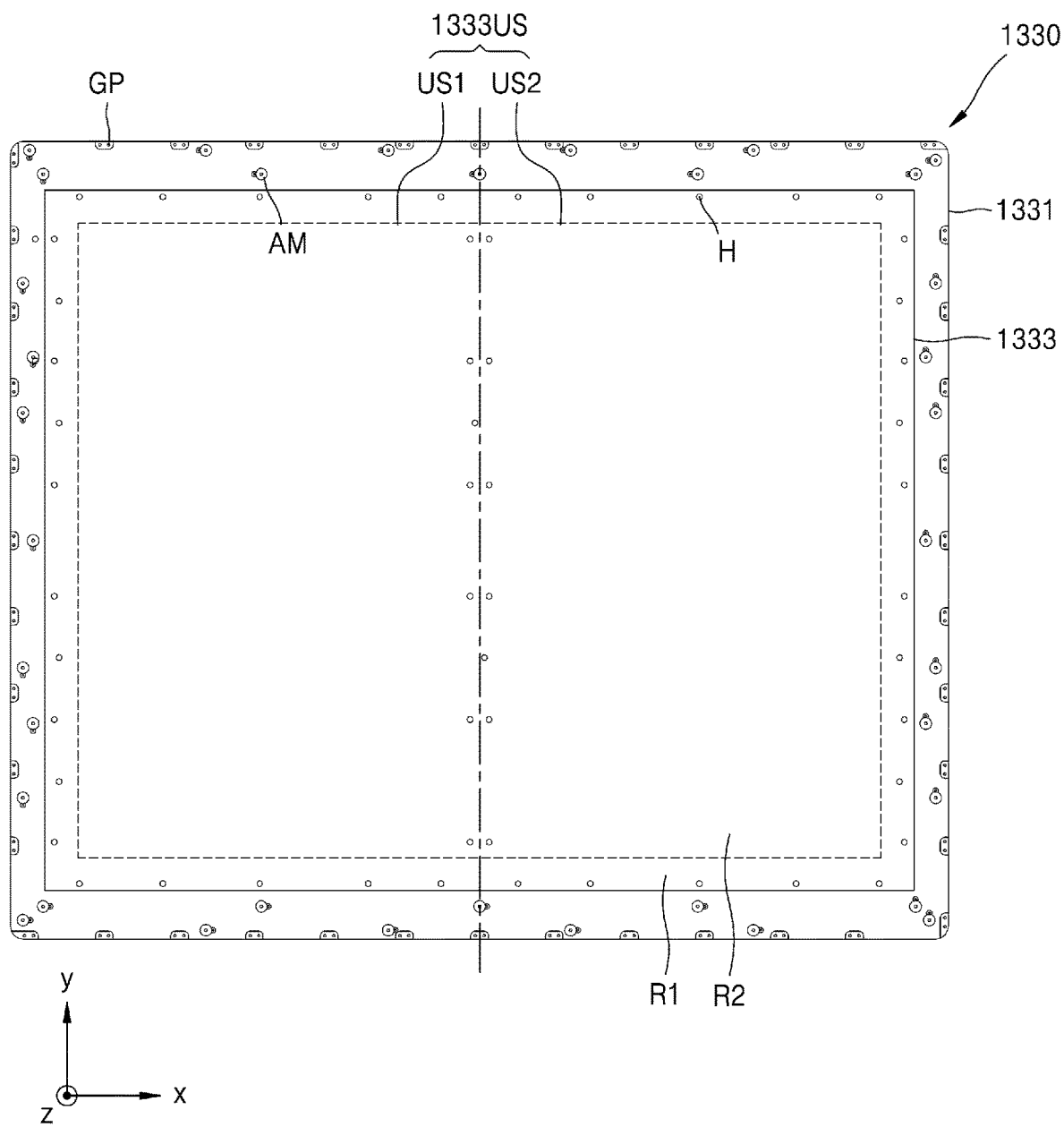
FIG. 3 is a schematic plan view of a susceptor according to an embodiment.
Figure 4:
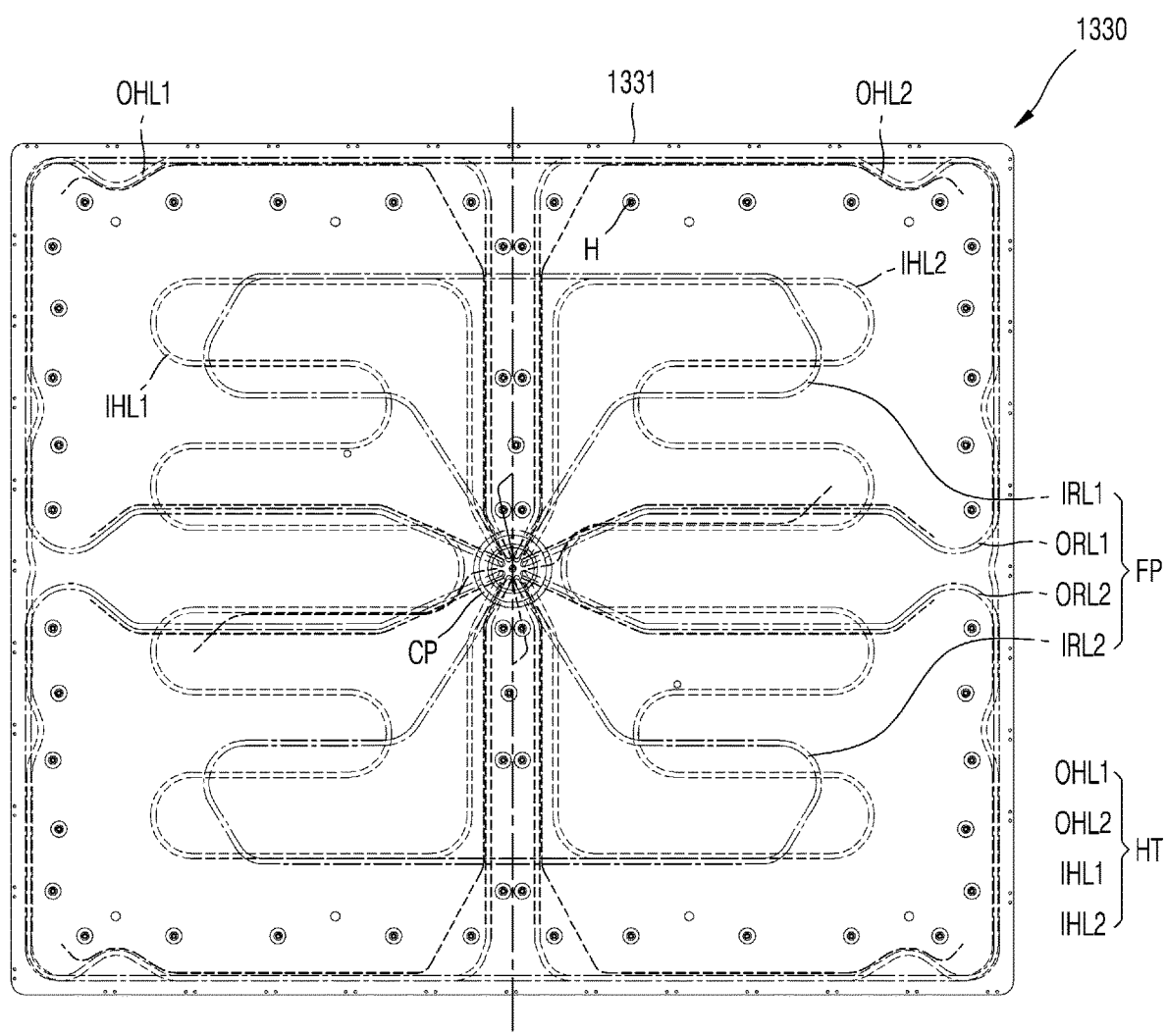
FIG. 4 is a schematic rear view of the susceptor of FIG. 3, schematically illustrating a heater and a flow path.
Figure 5:
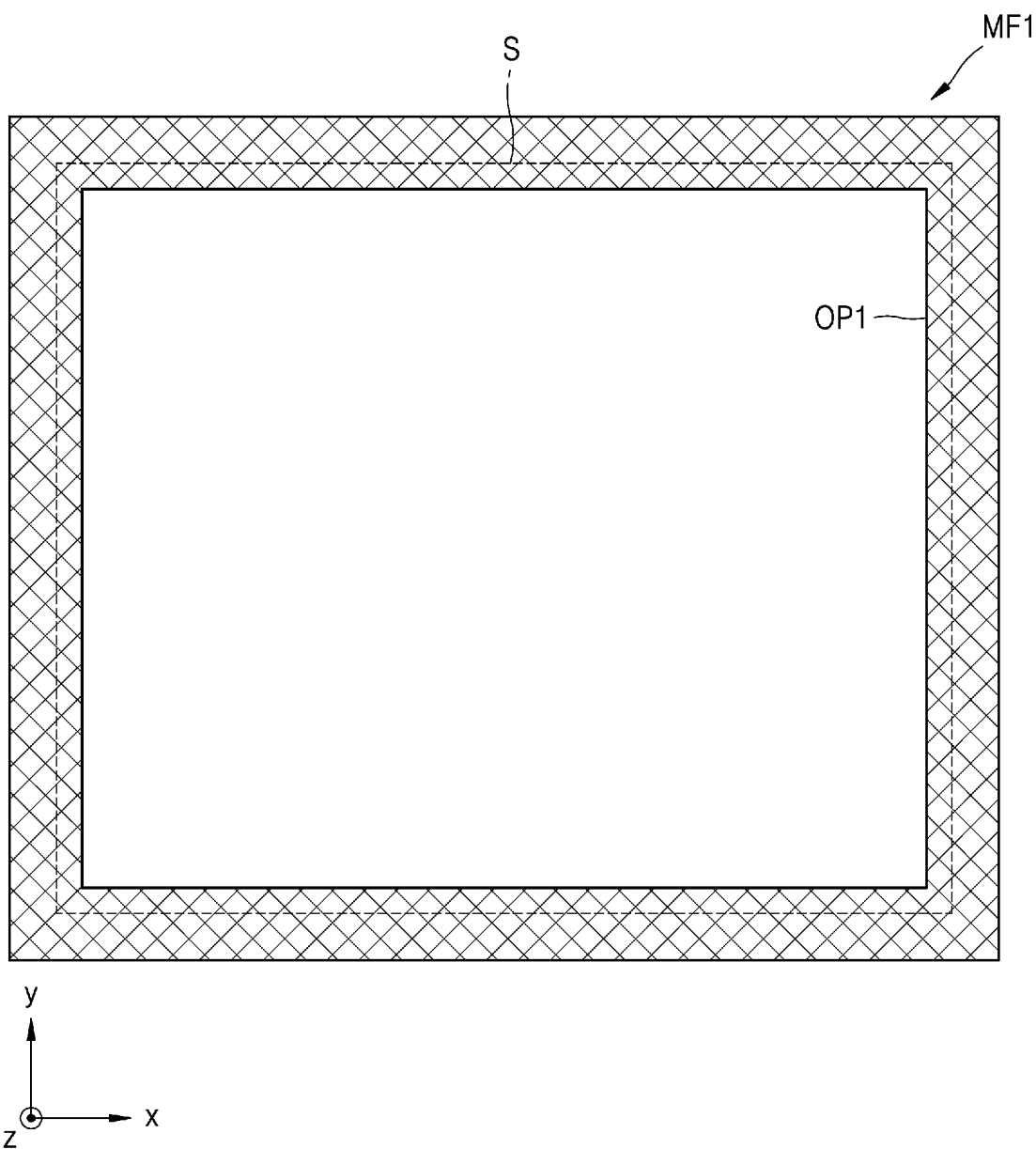
FIG. 5 is a schematic plan view of a display substrate and a first mask frame.
Figure 6:
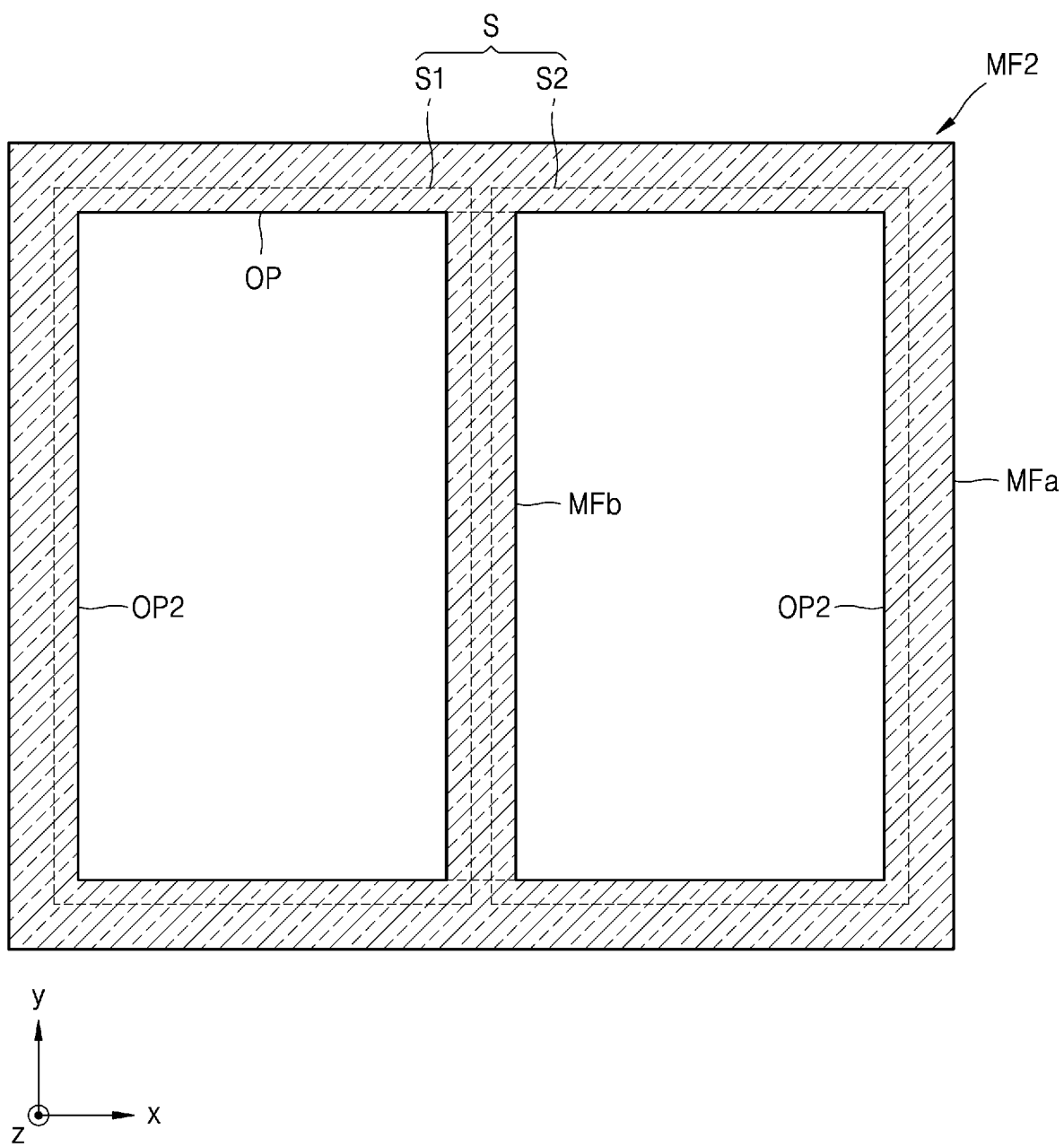
FIG. 6 is a schematic plan view of the display substrate and a second mask frame.

FIG. 3 is a schematic plan view of the susceptor 1330 according to an embodiment. FIG. 4 is a schematic rear view of the susceptor 1330 of FIG. 3, schematically illustrating the heater HT and the flow path FP. FIG. 5 is a schematic plan view of the display substrate S and a first mask frame MF1. FIG. 6 is a schematic plan view of the display substrate S and a second mask frame MF2. In FIGS. 3 to 6, as the same reference numerals as those in FIG. 2 denote the same elements, redundant descriptions thereof are omitted.

Referring to FIG. 3, the susceptor 1330 may include the body part 1331 and the support plate 1333. The body part 1331 may include an alignment mark AM and a ground portion GP. The alignment mark AM may be disposed on the body part 1331 along the edge of the support plate 1333. The alignment mark AM may function to align the mask frame, and the alignment mark AM may include a recess. In one embodiment, the mask frame may include a protruding portion corresponding to the alignment mark AM. The protruding portion of the mask frame may be inserted in the recess of the alignment mark AM.

In one embodiment, a damage prevention portion (not shown) may be disposed in the recess of the alignment mark AM. The damage prevention portion may prevent the body part 1331 and/or the mask frame from being damaged due to contact of the body part 1331 and mask frame. The damage prevention portion may include a ceramic material.

The susceptor 1330 may be grounded through the ground portion GP. Accordingly, the susceptor 1330 may function as the lower electrode. The body part 1331 may include a plurality of ground portions as the ground portion GP, and the ground portions GP may be disposed along an edge of the body part 1331.

The display substrate S may be placed on an upper surface 1333US of the support plate 1333. The upper surface 1333US of the support plate 1333 may include a first surface US1 and a second surface US2. In this state, the first surface US1 and the second surface US2 may be surfaces on which a plurality of partial substrates, for example, a first partial substrate and a second partial substrate, may be disposed.

The support plate 1333 may include a first region R1 and a second region R2 surrounded by the first region R1. The first region R1 may correspond to the edge of the support plate 1333. The second region R2 may correspond to the central area of the support plate 1333. The hole H of the support plate 1333 may include a plurality of holes, and the holes H of the support plate 1333 may be disposed along the edge of the support plate 1333. In other words, the holes H of the support plate 1333 may be disposed along the first region R1. Furthermore, the holes H of the support plate 1333 may be disposed in the second region R2. Accordingly, in case that the support pins SP support the display substrate S, the central area of the display substrate S may be prevented from sagging. Furthermore, the support pins SP may stably support each of the partial substrates. In one embodiment, the holes H disposed in the first surface US1 and the holes H disposed in the second surface US2 may be arranged asymmetrically to a y direction. In some embodiments, the holes H disposed in the first surface US1 and the holes H disposed in the second surface US2 may be arranged symmetrically to the y direction.

Referring to FIG. 4, the susceptor 1330 may include the body part 1331 and the support plate 1333 (not shown in FIG. 4), and the heater HT and the flow path FP may be provided in the body part 1331. The support plate 1333 may include the holes H through which the support pins SP pass.

The heater HT may maintain the susceptor 1330 at the first temperature T1. The heater HT may be electrically connected to the heater control portion HC through the center part CP. In one embodiment, the heater HT may include a first outer heater line OHL1, a second outer heater line OHL2, a first inner heater line IHL1, and a second inner heater line IHL2. In this state, the first outer heater line OHL1 and the second outer heater line OHL2 may be arranged symmetrically to the y direction. The first inner heater line IHL1 and the second inner heater line IHL2 may be symmetrically arranged to the y direction. As the first outer heater line OHL1 and the second outer heater line OHL2 may be the same as or similar to each other, the first outer heater line OHL1 is described in detail, and as the first inner heater line IHL1 and the second inner heater line IHL2 may be the same as or similar to each other, the first inner heater line IHL1 is described in detail.

The first outer heater line OHL1 may extend from the center part CP to be disposed along the edge of the body part 1331. At least part of the first outer heater line OHL1 may include a curved part. The first inner heater line IHL1 may be disposed at an inner side relative to the first outer heater line OHL1. In other words, the first outer heater line OHL1 may surround the first inner heater line IHL1. The first inner heater line IHL1 may extend from the center part CP in a serpentine pattern. Both of the first outer heater line OHL1 and the first inner heater line IHL1 may be disposed apart from the holes H of the support plate 1333.

The coolant may circulate through the flow path FP, and thus the susceptor 1330 may be maintained at the second temperature T2. The flow path FP may be extended to the coolant control portion RC through the center part CP. In this state, after the coolant is supplied to the coolant input portion RI and circulates through the flow path FP, the coolant may be discharged through the coolant output portion RO. In one embodiment, the flow path FP may include a tube, and the coolant may circulate through the tube.

In one embodiment, the flow path FP may include a first outer flow path line ORL1, a second outer flow path line ORL2, a first inner flow path line IRL1, and a second inner flow path line IRL2. In this state, the first outer flow path line ORL1 and the second outer flow path line ORL2 may be arranged symmetrically to an x direction. The first inner flow path line IRL1 and the second inner flow path line IRL2 may be arranged symmetrically to the x direction. As the first outer flow path line ORL1 and the second outer flow path line ORL2 may be the same as or similar to each other, the first outer flow path line ORL1 is described in detail. As the first inner flow path line IRL1 and the second inner flow path line IRL2 may be the same as or similar to each other, the first inner flow path line IRL1 is described in detail.

The first outer flow path line ORL1 may extend from the center part CP to be arranged along the edge of the body part 1331. At least part of the first outer flow path line ORL1 may include a curved part. The first outer flow path line ORL1 may at least partially overlap the first outer heater line OHL1 or the second outer heater line OHL2. The first inner flow path line IRL1 may be disposed at an inner side relative to the first outer flow path line ORL1. In other words, the first outer flow path line ORL1 may surround the first inner flow path line IRL1. The first inner flow path line IRL1 may be disposed crossing the first inner heater line IHL1 or the second inner heater line IHL2. The first outer flow path line ORL1 and the first inner flow path line IRL1 all may be disposed apart from the holes H of the support plate 1333.

Referring to FIG. 5, the first mask frame MF1 may include a first opening OP1. In this state, the display substrate S may be disposed corresponding to the first opening OP1. The first mask frame MF1 may overlap the edge of the display substrate S. Accordingly, the deposition material may not be deposited on the edge of the display substrate S. The first opening OP1 may expose a central area of the display substrate S. Accordingly, the deposition material may be deposited only in the central area of the display substrate S.

In one embodiment, the first mask frame MF1 may fix the display substrate S. In case that the deposition material is deposited on the display substrate S, the display substrate S may be maintained flat.

Furthermore, in case that the edge of the display substrate S is exposed during a PECVD process, arc discharge may be generated. The deposition material may not be uniformly deposited on the display substrate S. In the embodiment, as the first mask frame MF1 covers the edge of the display substrate S, the generation of arc discharge may be prevented. Accordingly, the deposition material may be uniformly deposited on the display substrate S.

Referring to FIG. 6, the display substrate S may be divided into a plurality of partial substrates. The display substrate S may be divided into a plurality of partial substrates in a process of manufacturing a display apparatus. In the following description, for convenience of explanation, a case in which the display substrate S may be divided into a first partial substrate S1 and a second partial substrate S2 is described in detail.

The second mask frame MF2 may include a plurality of second openings OP2. The second mask frame MF2 may include a first frame part MFa and a second frame part MFb. In one embodiment, the first frame part MFa and the second frame part MFb may be integrally provided. In another embodiment, the first frame part MFa and the second frame part MFb may be independent frame parts. In the following description, a case in which the first frame part MFa and the second frame part MFb may be integrally provided is described in detail.

The first frame part MFa may include an opening OP. The shape of the first frame part MFa may be the same as the first mask frame MF1 of FIG. 5. In this state, the first partial substrate S1 and the second partial substrate S2 may be disposed corresponding to the opening OP of the first frame part MFa. The first frame part MFa may overlap an edge of the first partial substrate S1 and an edge of the second partial substrate S2.

In one embodiment, the second mask frame MF2 may fix the first partial substrate S1 and the second partial substrate S2. As the second mask frame MF2 covers the edge of the first partial substrate S1 and the edge of the second partial substrate S2, the generation of arc discharge may be prevented.

The second frame part MFb may extend in one direction. For example, the second frame part MFb may extend in the y direction in FIG. 6. The second frame part MFb may be disposed crossing the opening OP of the first frame part MFa, and the second frame part MFb may divide the opening OP of the first frame part MFa into the second openings OP2. In some embodiments, the second mask frame MF2 may include a plurality of second frame parts MFb. The second mask frame MF2 may include two or more second openings OP2, and the second frame parts MFb may be disposed in the first frame part MFa in a mesh shape.

A plurality of partial substrates may be disposed corresponding to the second openings OP2. For example, the first partial substrate S1 and the second partial substrate S2 may be disposed corresponding to the respective second openings OP2.

A display apparatus manufactured by the above-described apparatus for manufacturing a display apparatus is described in detail. A display apparatus, which is an apparatus for displaying an image, may include portable mobile devices such as game devices, multimedia devices, or ultracompact PCs. A display apparatus 1 to be described later may include a liquid crystal display, an electrophoretic display, an organic light-emitting display, an inorganic EL display, a field emission display, a surface-conduction electron-emitter display, a quantum dot display, a plasma display, a cathode ray display, etc. In the following description, although an organic light-emitting display apparatus is described as an example of the display apparatus according to an embodiment, the above-described various types of display apparatuses may be used in one or more embodiments.

Figure 7:
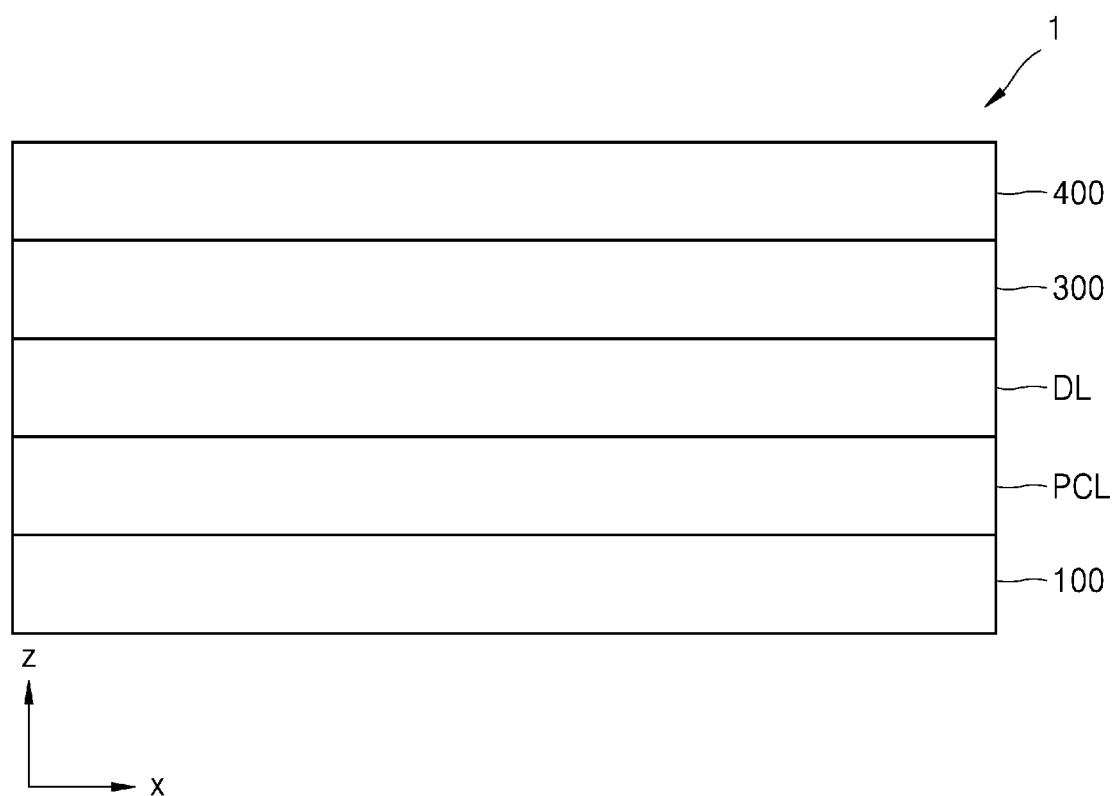
FIG. 7 is a schematic cross-sectional view of a display apparatus manufactured by the apparatus for manufacturing a display apparatus of FIG. 1.

FIG. 7 is a schematic cross-sectional view of the display apparatus 1 manufactured by the apparatus 1000 for manufacturing a display apparatus of FIG. 1.

Referring to FIG. 7, the display apparatus 1 may include a substrate 100, a pixel circuit layer PCL including a thin film transistor and an insulating layer on the substrate 100, a display layer DL including a display component on the pixel circuit layer PCL, an encapsulation layer 300 covering the display component, and an input sensing portion 400 on the encapsulation layer 300.

The substrate 100 may include glass or polymer resin such as polyethersulfone, polyarylate, polyetherimide, polyethylene naphthalate, polyethylene terephthalate, polyphenylene sulfide, polyimide, PC, TAC, cellulose acetate propionate, or a combination thereof.

A buffer layer (not shown) may be further included between the pixel circuit layer PCL and the substrate 100. The buffer layer, which is a layer for preventing intrusion of foreign materials, may include a single layer or a multilayer containing an inorganic material such as silicon nitride, silicon oxide, or a combination thereof.

The display layer DL may include a display component, for example, an organic light-emitting diode (OLED). The pixel circuit layer PCL may include a pixel circuit electrically connected to the OLED and insulating layers. The pixel circuit layer PCL may include a plurality of thin film transistors and storage capacitors, and insulating layers disposed therebetween.

The display components may be covered by the encapsulation layer 300. In one embodiment, the encapsulation layer 300 may include at least one inorganic encapsulation layer and at least one organic encapsulation layer, which cover the display layer DL. The inorganic encapsulation layer may include one or more inorganic materials of aluminum oxide, titanium oxide, tantalum oxide, hafnium oxide, zinc oxide, silicon oxide, silicon nitride, and silicon oxynitride. The organic encapsulation layer may include a polymer-based material. The polymer-based material may include acrylic resin, epoxy resin, polyimide, polyethylene, etc., or a combination thereof. In one embodiment, the organic encapsulation layer may include acrylate.

In another embodiment, the encapsulation layer 300 may have a structure in which the substrate 100 and an upper substrate that may be a transparent member are coupled to each other by a sealing member so that an inner space between the substrate 100 and the upper substrate may be sealed. An absorbent or a filler may be located in the inner space. The sealing member may be a sealant, and in another embodiment, the sealing member may include a material that is cured by laser. For example, the sealing member may include frit. In detail, the sealing member may include an organic sealant such as urethane resin, epoxy resin, acrylic resin, or a combination thereof, or an inorganic sealant such as silicon, etc. The urethane resin may include, for example, urethane acrylate, etc. The acrylic resin may include, for example, butylacrylate, ethyl hexyl acrylate, etc., or a combination thereof. The sealing member may include a material that is thermally cured.

The input sensing portion 400 may include touch electrodes and may be disposed on the encapsulation layer 300. The input sensing portion 400 may obtain an external input, for example, coordinate information according to a touch event. The input sensing portion 400 may include touch electrodes and trace lines electrically connected to the touch electrodes. The input sensing portion 400 may sense an external input in a mutual capacitance method or a self capacitance method.

Although it is not illustrated, an optical function layer may be disposed on the input sensing portion 400. The optical function layer may reduce reflectance of light (external light) input to the display apparatus 1 from the outside, and/or may enhance color purity of the light emitted from the display apparatus 1. In one embodiment, the optical function layer may include a retarder and a polarizer. The retarder may be of a film type or a liquid crystal coating type and may include a $\lambda/2$ retarder and/or a $\lambda/4$ retarder. The polarizer may also be of a film type or a liquid crystal coating type. The film type may include a stretchable synthetic resin film, and the liquid crystal coating type may include liquid crystals oriented in an array. The retarder and polarizer may further include a protection film.

In another embodiment, the optical function layer may include a black matrix and color filters. The color filters may be arranged considering the color of light emitted from each of the pixels. Each of the color filters may include red, green, or blue pigment or dye. As another example, each of the color filters may further include quantum dots in addition to the above-described pigment or dye. As another example, some of the color filters may not include the above-described pigment or dye and may include scattering particles such as titanium oxide.

In another embodiment, the optical function layer may include a destructive interference structure. The destructive interference structure may include a first reflection layer and a second reflection layer, which may be disposed on different layers. First reflection light and second reflection light respectively reflected from the first reflection layer and the second reflection layer may destructively interfere with each other, and accordingly reflectance of the external light may be reduced.

Figure 8:
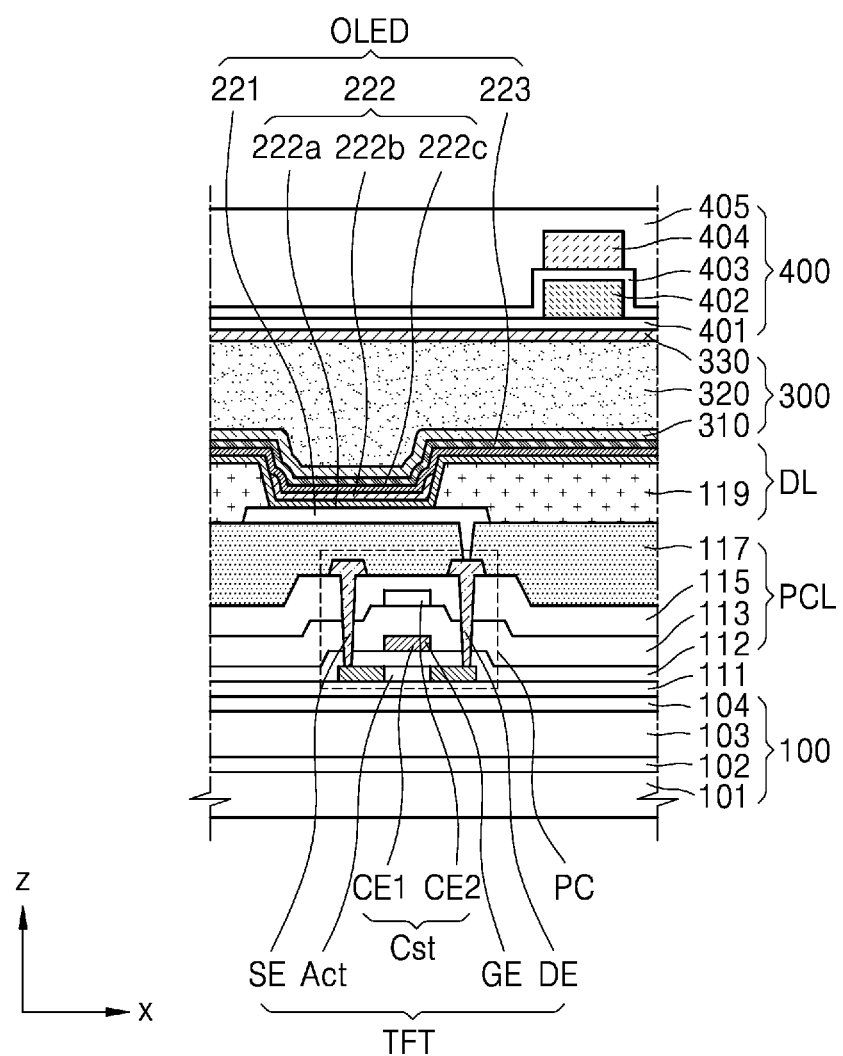
FIG. 8 is a schematic cross-sectional view of a part of the display apparatus of FIG. 7.

FIG. 8 is a schematic cross-sectional view of a part of a display apparatus. In FIG. 8, as the same reference numerals as those in FIG. 7 denote the same elements, redundant descriptions thereof are omitted Referring to FIG. 8, the display apparatus may include the substrate 100, a buffer layer 111, the pixel circuit layer PCL, the display layer DL, the encapsulation layer 300, and the input sensing portion 400. The pixel circuit layer PCL may include a pixel circuit PC and insulating layers disposed therebetween. The display layer DL may include the OLED. In the embodiment, the pixel circuit layer PCL may be formed in a range of about 150° C. or greater and about 400° C. or less. The input sensing portion 400 may be formed at about 150° C. or less.

In one embodiment, the substrate 100 may include a base layer including polymer resin and a barrier layer including an inorganic insulating material. For example, the substrate 100 may include a first base layer 101, a first barrier layer 102, a second base layer 103, and a second barrier layer 104, which may be sequentially stacked on each other. The first base layer 101 and the second base layer 103 may include polymer resin such as polyethersulfone, polyarylate, polyetherimide, polyethylene naphthalate, polyethylene terephthalate, polyphenylene sulfide, polyimide, PC, TAC, cellulose acetate propionate, etc., or a combination thereof. The first barrier layer 102 and the second barrier layer 104 may include an inorganic insulating material such as silicon oxide, silicon oxynitride, and/or silicon nitride.

The buffer layer 111 may be disposed on the substrate 100. The buffer layer 111 may reduce or block the intrusion of foreign materials, moisture, or external air from under the substrate 100. The buffer layer 111 may include an inorganic material, an organic material, or an organic/inorganic complex in a single layer or a multilayer structure of an inorganic material and an organic material.

The pixel circuit PC including a thin film transistor TFT and a storage capacitor Cst may be disposed on the buffer layer 111. The thin film transistor TFT may include a semiconductor layer Act, a gate electrode GE overlapping a channel region of the semiconductor layer Act, and a source electrode SE and a drain electrode DE respectively electrically connected to a source region and a drain region of the semiconductor layer Act. A gate insulating layer 112 may be provided between the semiconductor layer Act and the gate electrode GE, and a first interlayer insulating layer 113 and a second interlayer insulating layer 115 may be disposed between the gate electrode GE and the source electrode SE, or between the gate electrode GE and the drain electrode DE.

The storage capacitor Cst may overlap the thin film transistor TFT. The storage capacitor Cst may include a first capacitive plate CE1 and a second capacitive plate CE2, which overlap each other. In some embodiments, the gate electrode GE of the thin film transistor TFT may include the first capacitive plate CE1 of the storage capacitor Cst. The first interlayer insulating layer 113 may be disposed between the first capacitive plate CE1 and the second capacitive plate CE2.

The semiconductor layer Act may include polysilicon. In some embodiments, the semiconductor layer Act may include amorphous silicon. In some embodiments, the semiconductor layer Act may include an oxide of at least one selected from the group of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include the channel region and the source and drain regions doped with impurities.

The gate insulating layer 112 may include an inorganic insulating material such as silicon oxide, silicon oxynitride, or silicon nitride, and may have a single layer or a multilayer structure including the above-described material.

The gate electrode GE or the first capacitive plate CE1 may include a conductive material having low resistance such as molybdenum (Mo), aluminum (Al), copper (Cu), and/or titanium (Ti), and may have a single layer or a multilayer structure including the above-described material.

The first interlayer insulating layer 113 may include an inorganic insulating material such as silicon oxide, silicon oxynitride, or silicon nitride, and may have a single layer or a multilayer structure including the above-described material.

The second capacitive plate CE2 may include aluminum (Al), platinum (Pt), palladium (Pd), silver (Ag), magnesium (Mg), gold (Au), neodymium (Nd), iridium (Ir), chromium (Cr), nickel (Ni), calcium (Ca), molybdenum (Mo), titanium (Ti), tungsten (W), and/or copper (Cu), and may have a single layer or a multilayer structure including the above-described material.

The second interlayer insulating layer 115 may include an inorganic insulating material such as silicon oxide, silicon oxynitride, or silicon nitride, and may have a single layer or a multilayer structure including the above-described material.

The source electrode SE or the drain electrode DE may include aluminum (Al), platinum (Pt), palladium (Pd), silver (Ag), magnesium (Mg), gold (Au), neodymium (Nd), iridium (Ir), chromium (Cr), nickel (Ni), calcium (Ca), molybdenum (Mo), titanium (Ti), tungsten (W), and/or copper (Cu), and may have a single layer or a multilayer structure including the above-described material. For example, the source electrode SE or the drain electrode DE may have a triple layer structure of a titanium layer/an aluminum layer/a titanium layer.

A planarization layer 117 may include a material different from the material used for at least one inorganic insulating layer disposed thereunder, for example, the gate insulating layer 112, the first interlayer insulating layer 113, and the second interlayer insulating layer 115. The planarization layer 117 may include an organic insulating material. The planarization layer 117 may include an organic insulating material such as acryl, benzocyclobutene (BCB), polyimide, hexamethyldisiloxane (HMDSO), or a combination thereof. According to an embodiment, the organic insulating material of the planarization layer 117 may be a photosensitive organic insulating material.

A pixel electrode 221 may be disposed on the planarization layer 117. The pixel electrode 221 may be electrically connected to the thin film transistor TFT through a contact hole formed in the planarization layer 117.

The pixel electrode 221 may include a reflection film including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 221 may include a reflection film containing the above-described material, and a transparent conductive film disposed above or/and below the reflection film. The transparent conductive film may include indium tin oxide (ITO), indium zinc oxide (IZO), zinc oxide (ZnO), indium oxide ($In_2O_3$), indium gallium oxide (IGO), aluminum zinc oxide (AZO), or a combination thereof. In one embodiment, the pixel electrode 221 may have a triple layer structure of an ITO layer/an Ag layer/an ITO layer, which may be sequentially stacked on each other.

A pixel defining layer 119 may be disposed on the pixel electrode 221. The pixel defining layer 119 may cover an edge of the pixel electrode 221 and may include an opening that overlaps a central portion of the pixel electrode 221. The pixel defining layer 119 may include an organic insulating material and/or an inorganic insulating material. The opening may define an emission area of light emitted from the OLED.

An intermediate layer 222 may include an emission layer 222b that overlaps the pixel electrode 221. The emission layer 222b may include an organic material. The emission layer 222b may include a polymer organic material or a low molecular organic material that emits light of a color.

A first function layer 222a and a second function layer 222c may be disposed below and/or above the emission layer 222b.

The first function layer 222a may be a single layer or a multilayer. For example, in case that the first function layer 222a includes a polymer material, the first function layer 222a, as a hole transport layer (HTL) that is a single layer structure, may include poly-(3,4)-ethylene-dihydroxy thiophene (PEDOT), polyaniline, or a combination thereof. In case that the first function layer 222a includes a low molecular material, the first function layer 222a may include a hole injection layer (HIL) and the hole transport layer HTL.

The second function layer 222c may be optional. For example, in case that the first function layer 222a and the emission layer 222b include a polymer material, the second function layer 222c may be formed. The second function layer 222c may be a single layer or a multilayer. The second function layer 222c may include an electron transport layer (ETL) and/or an electron injection layer (EIL).

A counter electrode 223 may include a conductive material having a relatively low work function conductive material. For example, the counter electrode 223 may include a (semi) transparent layer including silver (Ag), magnesium (Mg), aluminum (Al), nickel (Ni), chromium (Cr), lithium (Li), calcium (Ca), or an alloy thereof. As another example, the counter electrode 223 may further include a layer including ITO, IZO, ZnO or $In_2O_3$ on the (semi) transparent layer including the above-described material. In one embodiment, the counter electrode 223 may include silver (Ag) and magnesium (Mg).

A stack structure of the pixel electrode 221, the intermediate layer 222, and the counter electrode 223, which may be sequentially stacked on each other, may form a light-emitting diode, for example, the OLED. The OLED may be covered by the encapsulation layer 300.

In one embodiment, the encapsulation layer 300 may include a first inorganic encapsulation layer 310 and a second inorganic encapsulation layer 330, and an organic encapsulation layer 320 therebetween.

The first inorganic encapsulation layer 310 and the second inorganic encapsulation layer 330 each may include one or more inorganic insulating materials. The inorganic insulating material may include aluminum oxide, titanium oxide, tantalum oxide, hafnium oxide, zinc oxide, silicon oxide, silicon nitride, or/and silicon oxynitride. The first inorganic encapsulation layer 310 and the second inorganic encapsulation layer 330 may be formed through the CVD.

The organic encapsulation layer 320 may include polymer-based material. The polymer-based material may include acrylic resin, epoxy resin, polyimide, polyethylene, etc., or a combination thereof. For example, the organic encapsulation layer 320 may include acrylic resin, for example, polymethyl methacrylate, polyacryl acid, etc., or a combination thereof. The organic encapsulation layer 320 may be formed by curing a monomer or coating a polymer.

The input sensing portion 400 may be disposed on the second inorganic encapsulation layer 330 and may include at least one inorganic film and a sensing electrode.

The input sensing portion 400 may include an insulating layer and a conductive layer, which may be alternately stacked on each other. In one embodiment, the input sensing portion 400 may include a first insulating layer 401, a first conductive layer 402, a second insulating layer 403, a second conductive layer 404, and a third insulating layer 405. The first conductive layer 402 and the second conductive layer 404 may be electrically connected to each other through a contact hole (not shown). The sensing electrode may be included in at least one of the first conductive layer 402 and the second conductive layer 404.

The first conductive layer 402 or second conductive layer 404 may include a metal layer or a transparent conductive layer. The metal layer may include molybdenum (Mo), mendelevium (Md), silver (Ag), titanium (Ti), copper (Cu), aluminum (Al), or an alloy thereof. The transparent conductive layer may include a transparent conductive oxide such as ITO, IZO, ZnO, indium tin zinc oxide (ITZO), or a combination thereof. The transparent conductive layer may include a conductive polymer such as PEDOT, a metal nano wire, graphene, etc., or a combination thereof.

The first conductive layer 402 or second conductive layer 404 may be a single layer or a multilayer. The first conductive layer 402 or second conductive layer 404 in a single layer may include a metal layer or a transparent conductive layer, and the materials of the metal layer and the transparent conductive layer are the same as described above. One of the first conductive layer 402 and the second conductive layer 404 may include a single metal layer. One of the first conductive layer 402 and the second conductive layer 404 may include a metal multilayer. The metal multilayer may include, for example, a triple layer of a titanium layer/an aluminum layer/a titanium layer, or a double layer of a molybdenum layer/a mendelevium layer. As another example, the metal multilayer may include a metal layer and a transparent conductive layer. The first conductive layer 402 and second conductive layer 404 may have different stack structures or the same stack structure. For example, the first conductive layer 402 may include a metal layer, and the second conductive layer 404 may include a transparent conductive layer. As another example, the first conductive layer 402 and the second conductive layer 404 may include the same metal layer.

The materials of the first conductive layer 402 and the second conductive layer 404 and the arrangement of the sensing electrodes provided in the first conductive layer 402 and the second conductive layer 404 may be determined considering sensing sensitivity. A resistance-capacitance (RC) delay may affect the sensing sensitivity. As the sensing electrodes including a metal layer have relatively less resistance compared with the transparent conductive layer, an RC value may decrease. Accordingly, a charge time of a capacitor defined between the sensing electrodes may be reduced. The sensing electrodes including the transparent conductive layer, compared with the metal layer, may not be seen by a user and may have an increased input area so as to increase capacitance.

Each of the first insulating layer 401, the second insulating layer 403, and the third insulating layer 405 may include an inorganic insulating material or/and an organic insulating material. The inorganic insulating material may include silicon oxide, silicon nitride, or silicon oxynitride, and the organic insulating material may include a polymer organic material. In some embodiments, the first insulating layer 401 may be omitted.

A method of manufacturing a display apparatus to form the pixel circuit layer PCL and the input sensing portion 400 is described in detail.

Figure 9:
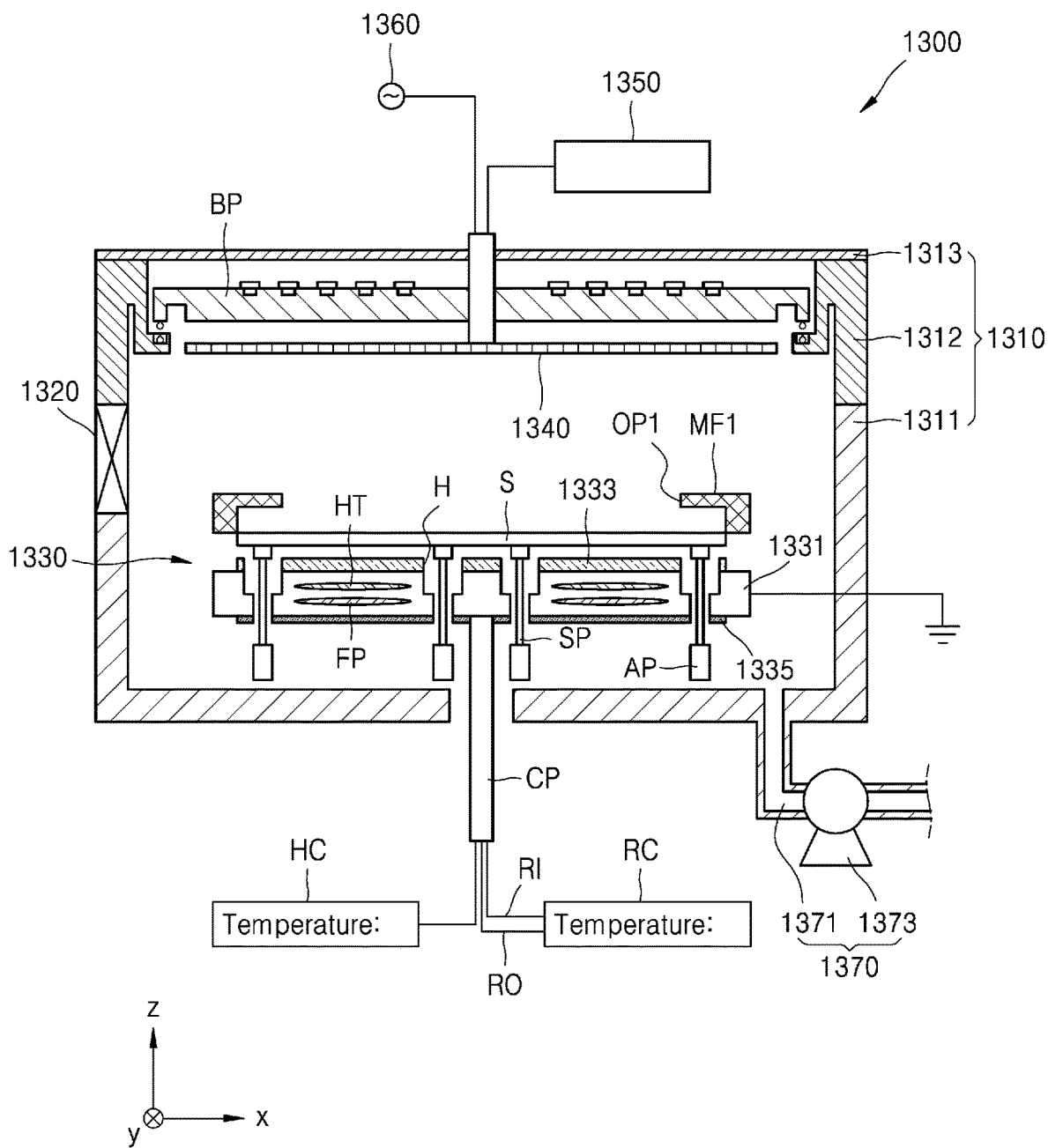
FIGS. 9, 10, and 11 are schematic cross-sectional views illustrating some operations of a method of manufacturing a display apparatus according to an embodiment.
Figure 10:
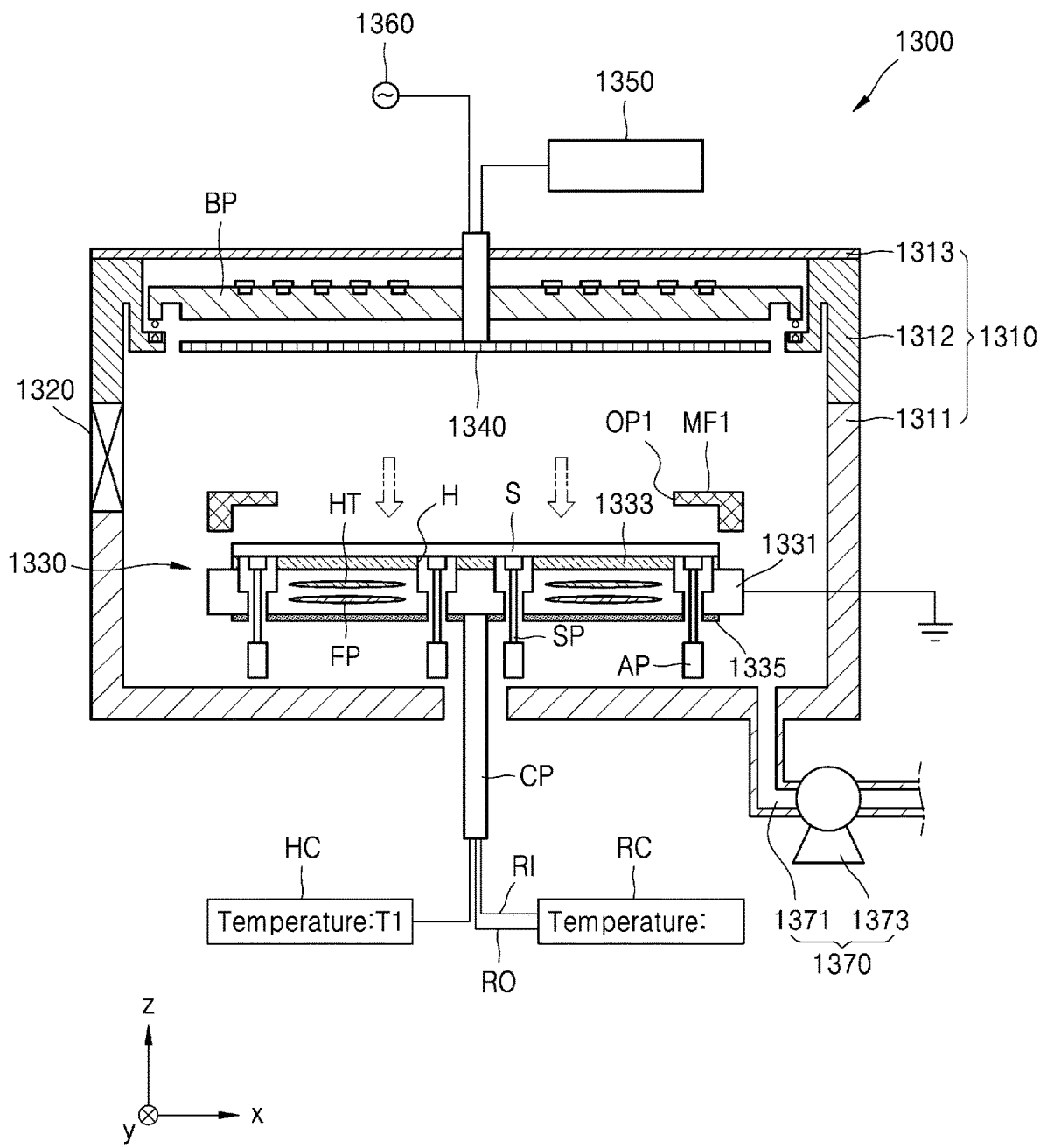
Figure 11:
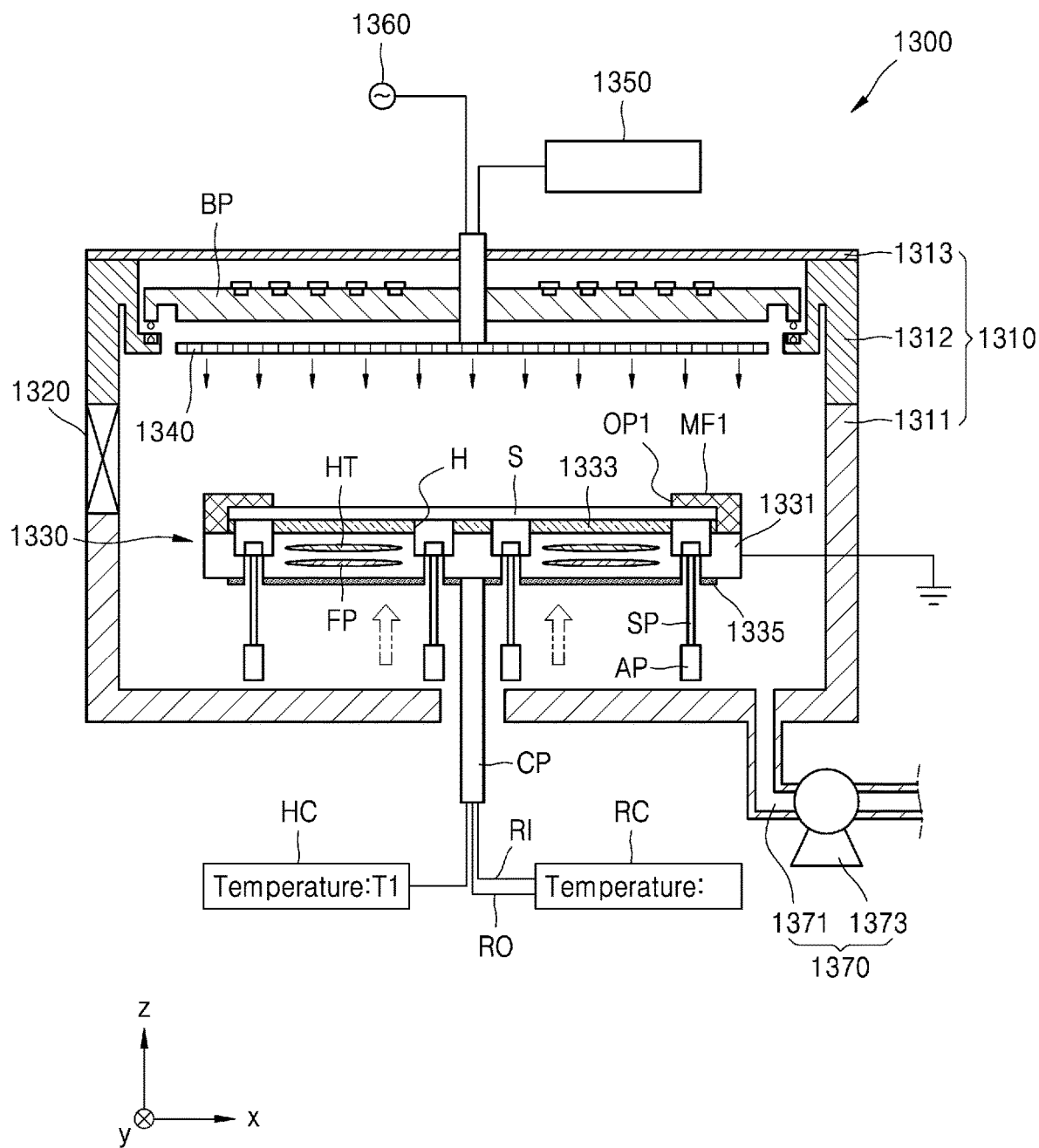
Figure 12:
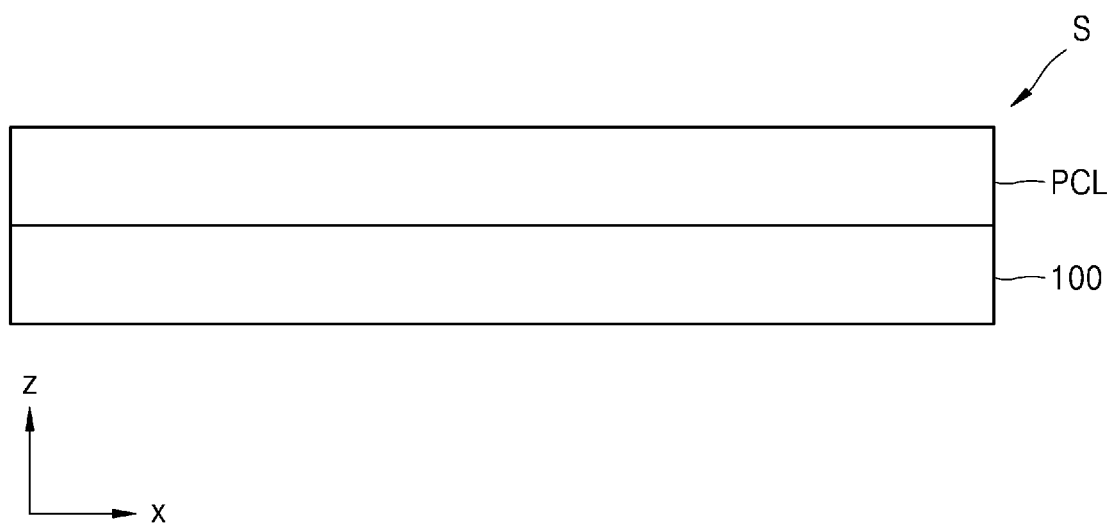
FIG. 12 is a schematic cross-sectional view of the display substrate on which a pixel circuit layer may be formed.
Figure 13:
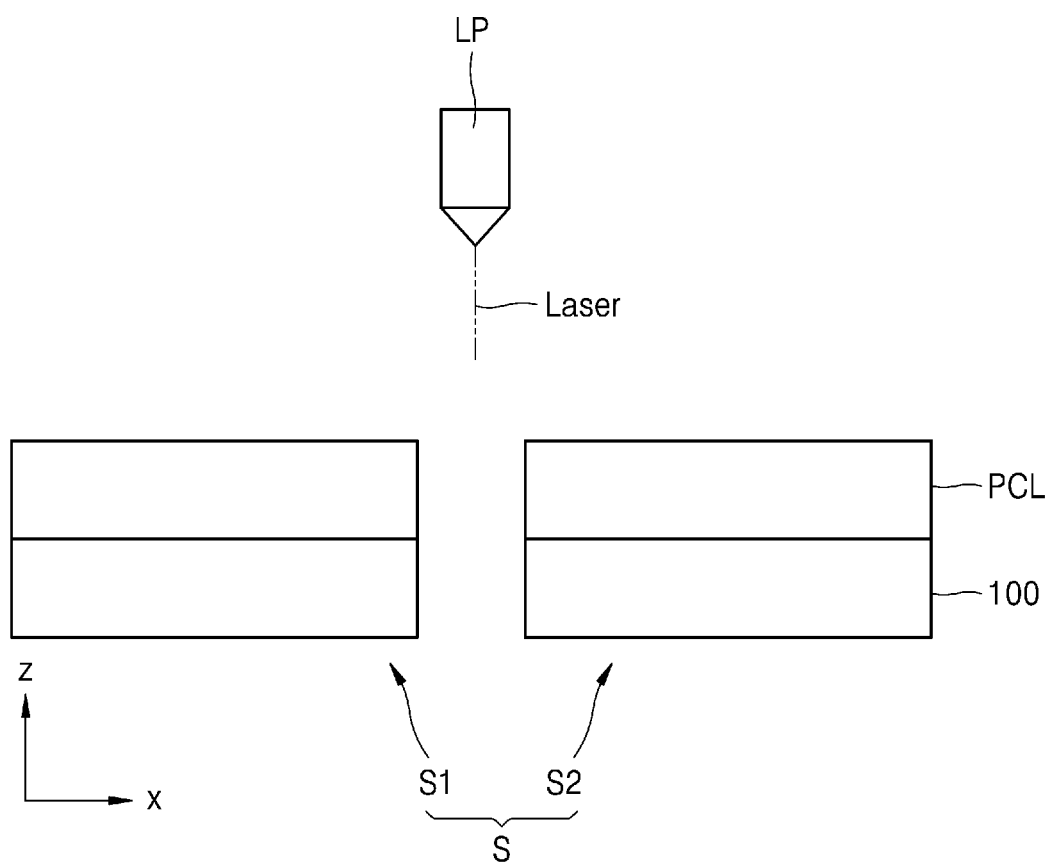
FIG. 13 is a schematic cross-sectional view of the display substrate divided by irradiating a laser beam thereto.
Figure 14:
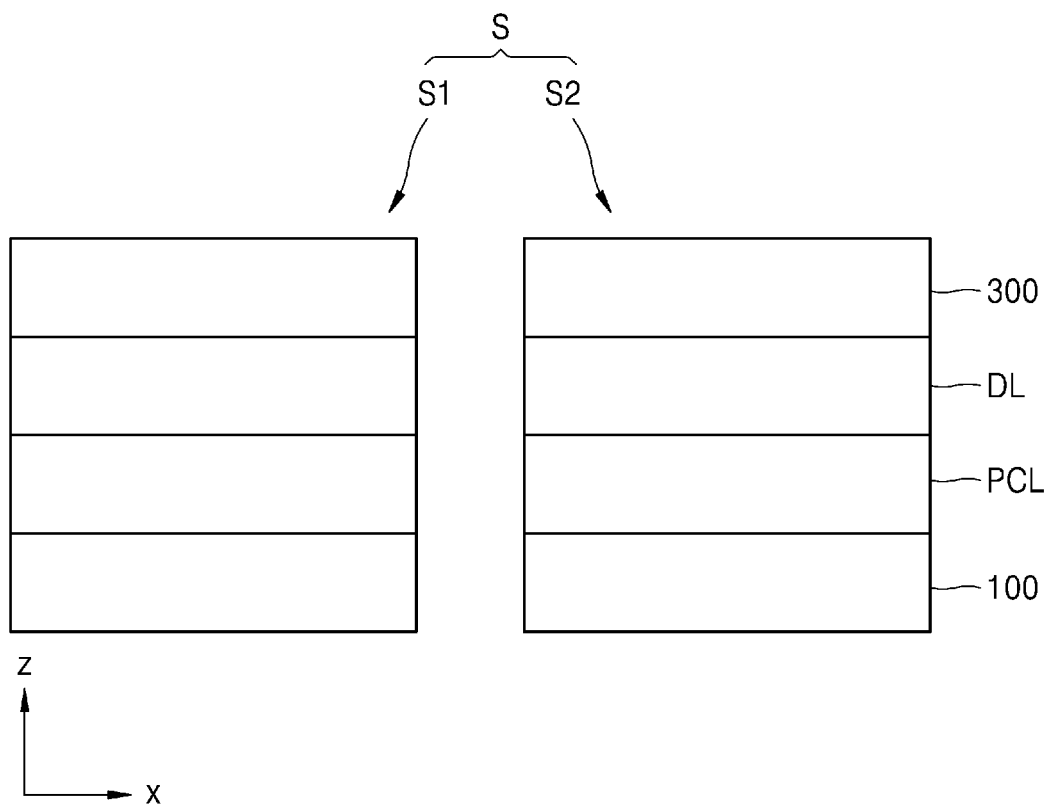
FIG. 14 is a schematic cross-sectional view of a display layer and an encapsulation layer formed on the display substrate.
Figure 15:
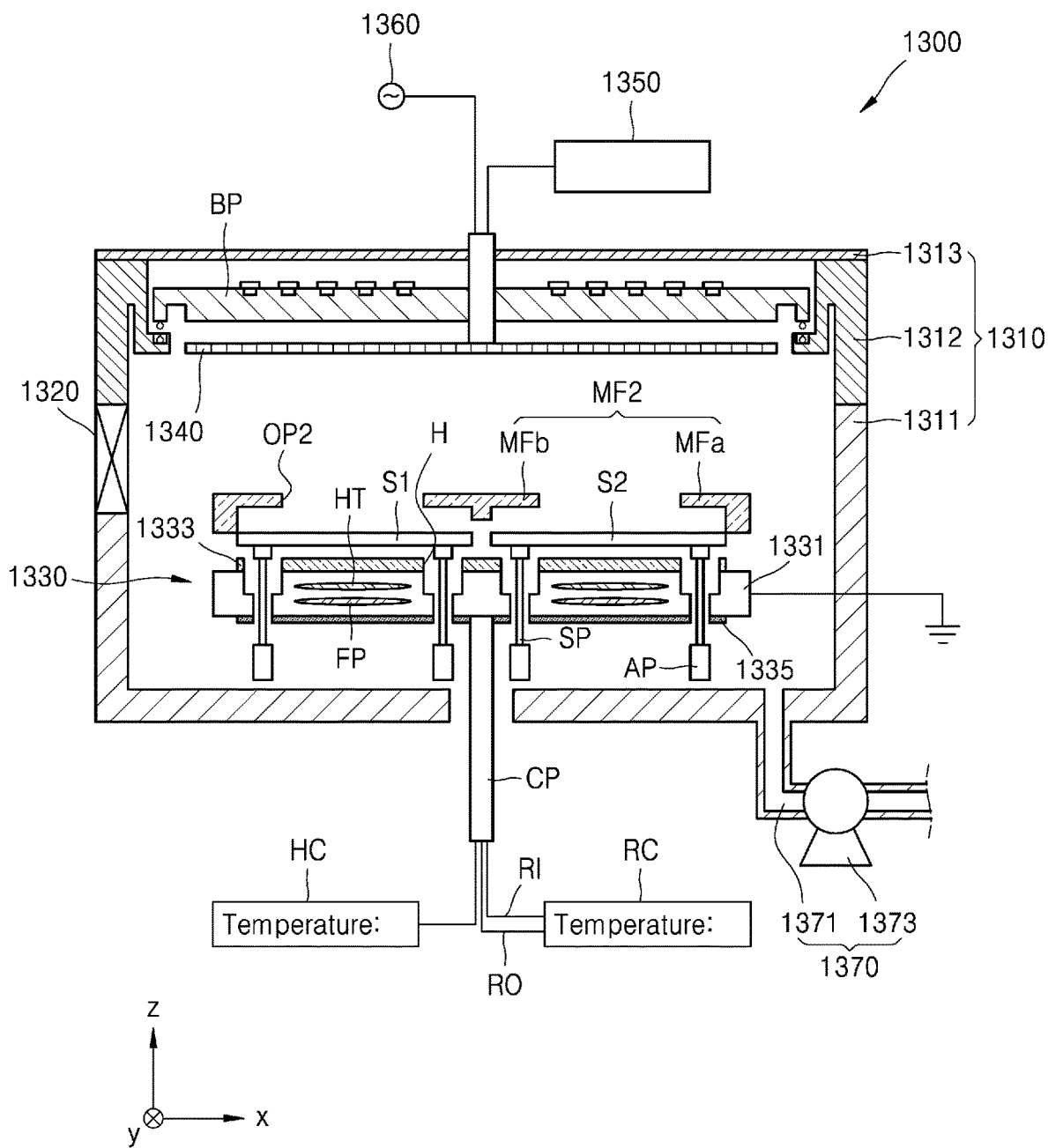
FIGS. 15, 16, and 17 are schematic cross-sectional views illustrating some operations of a method of manufacturing a display apparatus according to an embodiment.
Figure 16:
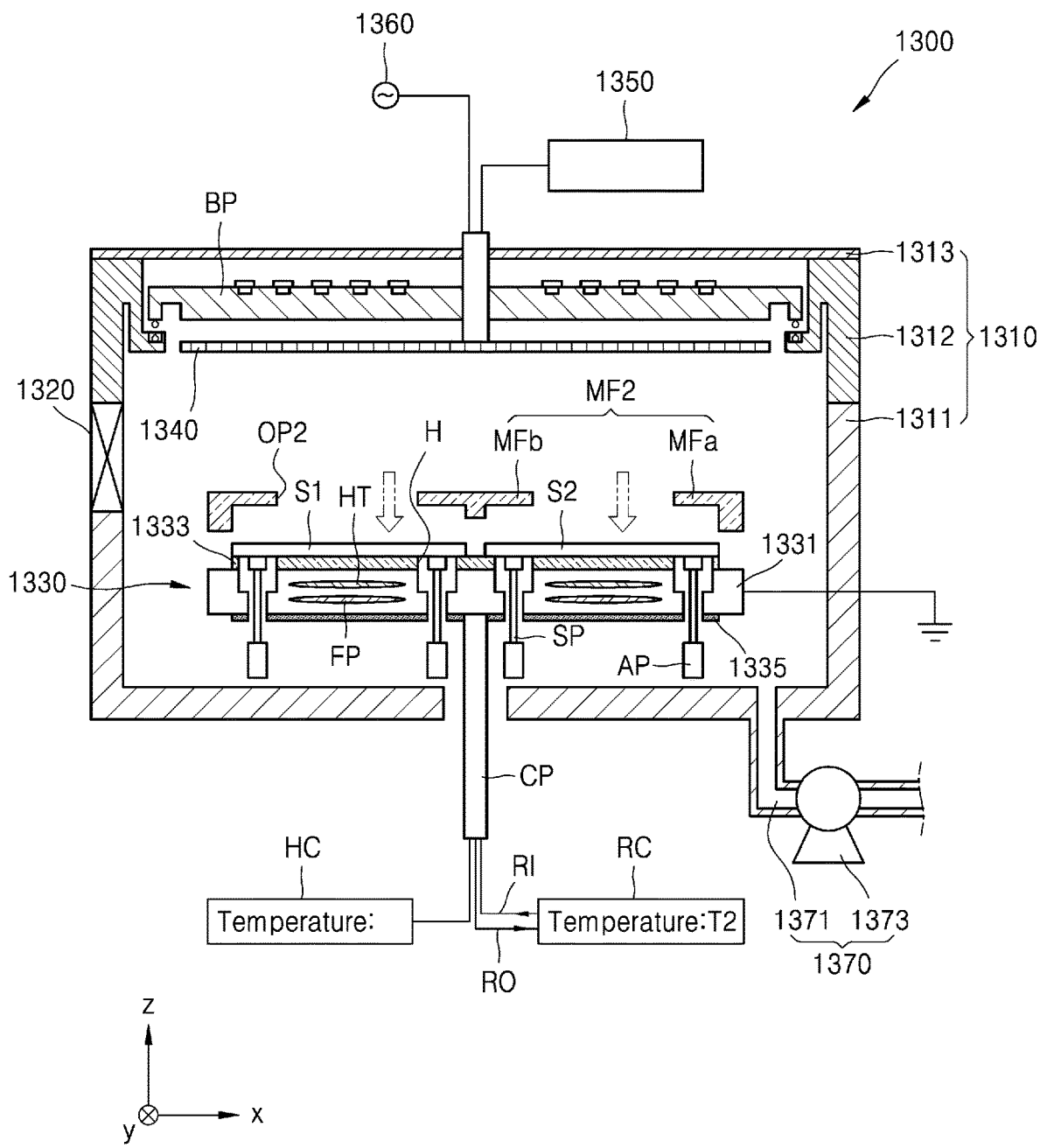
Figure 17:
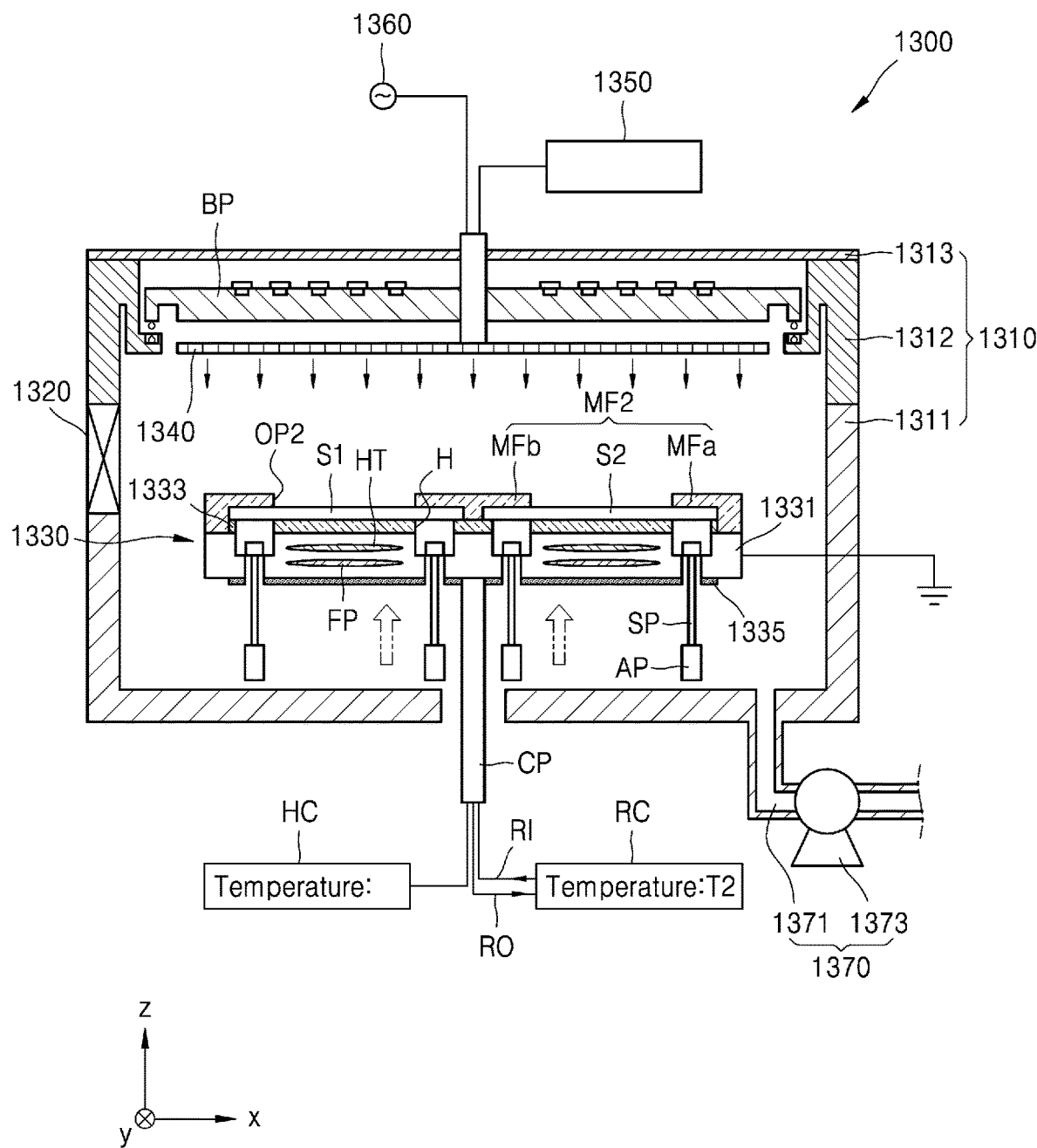
Figure 18:
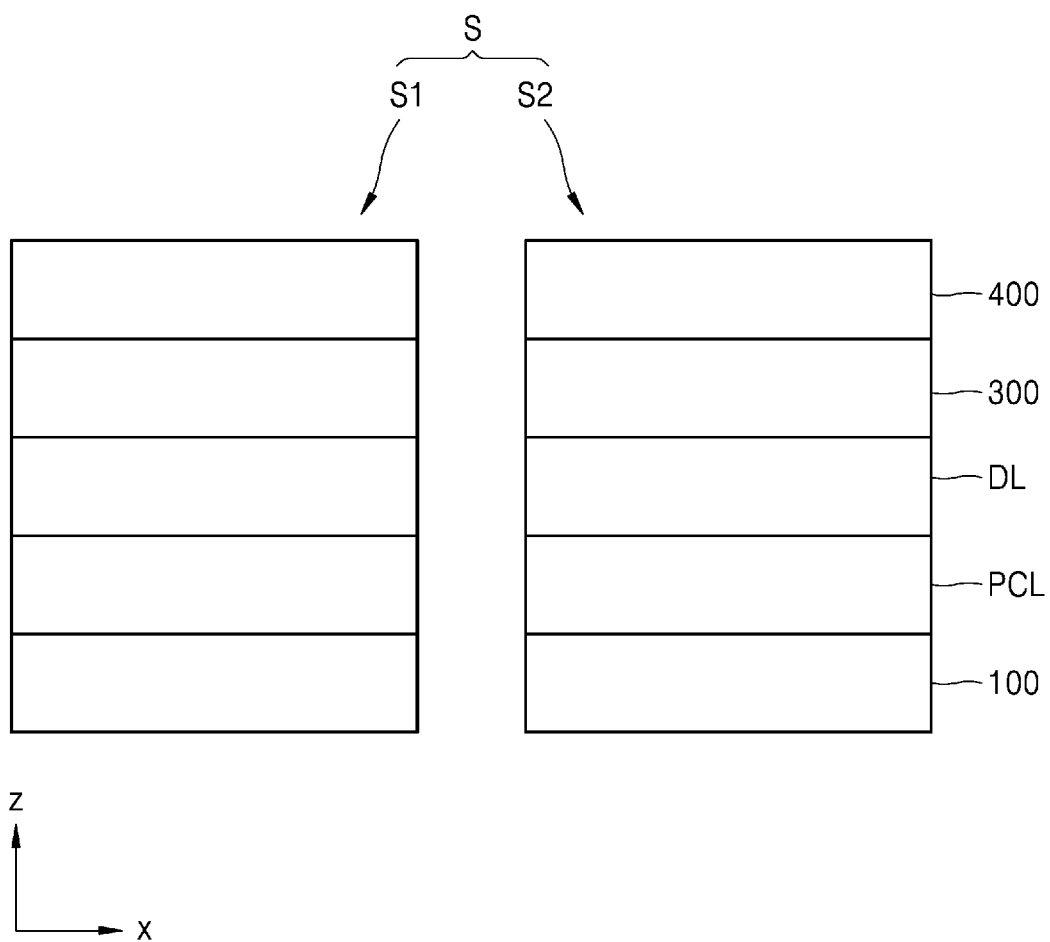
FIG. 18 is a schematic cross-sectional view of an input sensing portion formed on the display substrate.

FIGS. 9, 10, and 11 are schematic cross-sectional views illustrating some operations of a method of manufacturing a display apparatus according to an embodiment. FIG. 12 is a schematic cross-sectional view of the display substrate S on which the pixel circuit layer PCL may be formed. FIG. 13 is a schematic cross-sectional view of the display substrate S being divided by irradiating a laser beam thereto. FIG. 14 is a schematic cross-sectional view of the display layer DL and the encapsulation layer 300 formed on the display substrate S. FIGS. 15, 16, and 17 are schematic cross-sectional views illustrating some operations of a method of manufacturing a display apparatus according to an embodiment. FIG. 18 is a schematic cross-sectional view of the input sensing portion 400 formed on the display substrate S.

Referring to FIG. 9, the display substrate S may be transferred by a robot arm of a transfer chamber and may pass through the opening/closing portion 1320 to be loaded in the processing portion 1300. The support pin SP may pass through the holes H of the support plate 1333 to be located higher than the support plate 1333 of the susceptor 1330. Accordingly, the display substrate S may be placed on the support pin SP.

The display substrate S may be a mother substrate that is a set of cell areas. In this state, each of cell areas may be a part of a display apparatus being manufactured. The display substrate S may include the substrate 100 (see FIG. 7 or 8).

The first mask frame MF1 may be disposed inside the chamber 1310. The first mask frame MF1 may be disposed above the susceptor 1330. In other words, the first mask frame MF1 may be disposed facing the susceptor 1330.

In one embodiment, the first mask frame MF1 may be fixed in the chamber 1310. For example, the first mask frame MF1 may be fixed to an inner side of the first part 1311 of the chamber 1310. In another embodiment, the first mask frame MF1 may be disposed to be movable inside the chamber 1310. For example, the first mask frame MF1 may be extended to a cylinder or a linear motor and may ascend or descend in the z direction. In the following description, a case in which the first mask frame MF1 may be fixed in the chamber 1310 is described in detail.

Referring to FIG. 10, the display substrate S may be placed on the susceptor 1330 in the chamber 1310. In other words, the display substrate S may be placed on the support plate 1333. In this state, one of the support pin SP and the susceptor 1330 moves relative to another of the support pin SP and the susceptor 1330 so that the display substrate S may be placed on the support plate 1333. For example, as the support pin adjustment portion AP extended to the support pin SP is operated, the support pin SP may descend, and the display substrate S placed on the support pin SP may be placed on the support plate 1333. In another example, the susceptor 1330 may ascend, and the display substrate S placed on the support pin SP may be placed on the support plate 1333.

One of the first mask frame MF1 and the display substrate S may be aligned to another of the first mask frame MF1 and the display substrate S. In detail, the first mask frame MF1 and the display substrate S may be aligned with respect to an alignment mark (not shown) provided in the body part 1331.

The susceptor 1330 may be maintained at the first temperature T1 that is preset. In this state, the heater HT of the susceptor 1330 may be operated, the heater HT may maintain the susceptor 1330 at the first temperature T1. The first temperature T1 may be about 150° C. or greater and about 400° C. or less. The heater HT may be controlled by the heater control portion HC. Accordingly, the display substrate S may be maintained at a generally uniform temperature.

Referring to FIG. 11, the susceptor 1330 may ascend. In this state, the center part CP of the susceptor 1330 may include a cylinder or a linear motor to move the susceptor 1330 upwards.

In one embodiment, the first mask frame MF1 may include a protruding portion corresponding to the alignment mark of the body part 1331. The protruding portion of the first mask frame MF1 may be inserted in the recess of the alignment mark.

The first mask frame MF1 may overlap the edge of the display substrate S. Accordingly, during a process, the first mask frame MF1 may shield the edge of the display substrate S. The first opening OP1 of the first mask frame MF1 may expose the central area of the display substrate S. As the first mask frame MF1 covers the edge of the display substrate S, the generation of arc discharge may be prevented.

In one embodiment, the first mask frame MF1 may fix the display substrate S. Accordingly, the display substrate S may be maintained flat.

The pixel circuit layer PCL may be formed on the display substrate S. In detail, a deposition material may be sprayed through the spray portion 1340 located at the opposite side of the susceptor 1330 with respect to the first mask frame MF1. In the embodiment, while the spray portion 1340 sprays the deposition material, the heater HT may be operated. Accordingly, the susceptor 1330 may be maintained at the first temperature T1.

In case that the spray portion 1340 sprays the deposition material, the power portion 1360 may supply AC power. The spray portion 1340 may function as an upper electrode, and the susceptor 1330 may be grounded to function as a lower electrode. Accordingly, plasma may be formed between the spray portion 1340 and the susceptor 1330. The edge of the display substrate S may be protected by the first mask frame MF1.

In the embodiment, the deformation prevention part 1335 may prevent thermal deformation of the body part 1331. In detail, in case that the body part 1331 is maintained at the first temperature T1, thermal deformation may be generated. The body part 1331 may sag with respect to the center part CP. In the embodiment, as the deformation prevention part 1335 includes a ceramic material and supports the body part 1331, the deformation of the body part 1331 may be prevented.

Referring to FIG. 12, the pixel circuit layer PCL may be formed on the substrate 100 of the display substrate S. In other words, the pixel circuit layer PCL may be formed on the substrate 100 while the susceptor 1330 maintains the first temperature T1 as the heater HT is operated.

The display substrate S may be separated from the susceptor 1330 and transferred from the processing portion 1300 to the transfer portion 1200. In this state, the robot arm of the transfer portion 1200 may transfer the display substrate S to the transfer portion 1200.

Referring to FIG. 13, the display substrate S may be divided into a plurality of partial substrates. For example, the display substrate S may be divided into the first partial substrate S1 and the second partial substrate S2. In one embodiment, the display substrate S may be divided by using laser. For example, a laser irradiation portion LP irradiates laser toward the display substrate S to divide the display substrate S into the first partial substrate S1 and the second partial substrate S2. In another example, the display substrate S may be divided by using a knife.

Referring to FIG. 14, the display layer DL and the encapsulation layer 300 may be formed on the display substrate S. In detail, the display layer DL and the encapsulation layer 300 may be respectively formed on the pixel circuit layer PCL of the first partial substrate S1 and the pixel circuit layer PCL of the second partial substrate S2.

Referring to FIG. 15, the first partial substrate S1 and the second partial substrate S2 may be transferred by the robot arm of the transfer chamber and loaded in the processing portion 1300 by passing through the opening/closing portion 1320.

The first partial substrate S1 and the second partial substrate S2 each may be placed on the support pins SP. As the holes H through which the support pins SP pass may be disposed not only in the edge of the support plate 1333, but also in the central area of the support plate 1333, the support pins SP may pass through the holes H and stably support the first partial substrate S1 and the second partial substrate S2. As the first partial substrate S1 and the second partial substrate S2 being placed on the support pins SP may be similar to the display substrate S being placed on the support pins SP, a detailed description thereof is omitted.

In one embodiment, the first mask frame MF1 of FIG. 9 may be replaced with the second mask frame MF2 of FIG. 15. The second mask frame MF2 may be disposed inside the chamber 1310. The second mask frame MF2 may be disposed above the susceptor 1330. In other words, the second mask frame MF2 may be disposed facing the susceptor 1330.

In one embodiment, the second mask frame MF2 may be fixed inside the chamber 1310. In another embodiment, the second mask frame MF2 may be disposed to be movable inside the chamber 1310. In the following description, a case in which the second mask frame MF2 may be fixed inside the chamber 1310 is described in detail.

Referring to FIG. 16, the first partial substrate S1 and the second partial substrate S2 may be placed on the susceptor 1330 in the chamber 1310. In this state, as one of the support pins SP and the susceptor 1330 moves relative to another of the support pins SP and the susceptor 1330, the first partial substrate S1 and the second partial substrate S2 may be placed on the support plate 1333. As the first partial substrate S1 and the second partial substrate S2 being placed on the susceptor 1330 may be similar to the display substrate S being placed on the susceptor 1330, a detailed description thereof is omitted.

One of the second mask frame MF2 and the first partial substrate S1 may be aligned to another of the second mask frame MF2 and the first partial substrate S1. Furthermore, one of the second mask frame MF2 and the second partial substrate S2 may be aligned to another of the second mask frame MF2 and the second partial substrate S2.

The susceptor 1330 may be maintained at the second temperature T2 that is preset. In this state, the coolant may circulate through the flow path FP of the susceptor 1330. In detail, the coolant supplied by the coolant control portion RC may be supplied to the flow path FP through the coolant input portion RI. After the coolant circulates through the flow path FP of the susceptor 1330, the coolant may be discharged through the coolant output portion RO. The coolant control portion RC may control the coolant circulating through the flow path FP to be at the second temperature T2. Accordingly, the first partial substrate S1 and the second partial substrate S2 may be maintained at a generally uniform temperature. The second temperature T2 may be about 150° C. or less, and the coolant may include PFPE. For example, the coolant may include a Galden fluid.

Referring to FIG. 17, the susceptor 1330 may ascend. In this state, the center part CP of the susceptor 1330 may include a cylinder or a linear motor to move the susceptor 1330 upwards.

In one embodiment, the second mask frame MF2 may include a protruding portion corresponding to the alignment mark of the body part 1331. The protruding portion of the second mask frame MF2 may be inserted in the recess of the alignment mark.

The second mask frame MF2 may overlap the edge of the first partial substrate S1 and the edge of the second partial substrate S2. In detail, the first frame part MFa and the second frame part MFb may overlap the edge of the first partial substrate S1 and the edge of the second partial substrate S2. The second frame part MFb may overlap the edge of the first partial substrate S1 and the edge of the second partial substrate S2 facing each other.

During a process, the second mask frame MF2 may shield the edge of the first partial substrate S1 and the edge of the second partial substrate S2. The second openings OP2 of the second mask frame MF2 each may expose the central area of each of the first partial substrate S1 and the second partial substrate S2.

The input sensing portion may be formed on each of the first partial substrate S1 and the second partial substrate S2. In detail, the deposition material may be sprayed through the spray portion 1340 disposed at the opposite side of the susceptor 1330 with respect to the second mask frame MF2. In the embodiment, while the spray portion 1340 sprays the deposition material, the coolant may circulate through the flow path FP of the susceptor 1330. Accordingly, the susceptor 1330 may be maintained at the second temperature T2.

In case that the spray portion 1340 sprays the deposition material, the power portion 1360 may supply AC power. The edge of the first partial substrate S1 and the edge of the second partial substrate S2 may be protected by the second mask frame MF2. As the second mask frame MF2 covers the edge of the first partial substrate S1 and the edge of the second partial substrate S2, the generation of arc discharge may be prevented.

Referring to FIG. 18, the input sensing portion 400 may be formed on the substrate 100 of the first partial substrate S1 and the second partial substrate S2. In other words, while the coolant circuits through the flow path FP of the susceptor 1330 so that the susceptor 1330 is maintained at the second temperature T2, the input sensing portion 400 may be formed on the encapsulation layer 300.

The first partial substrate S1 and the second partial substrate S2 may be separated from the susceptor 1330 and transferred from the processing portion 1300 to the transfer portion 1200. In this state, the robot arm of the transfer portion 1200 may transfer the first partial substrate S1 and the second partial substrate S2 to the transfer portion 1200.

In the embodiment, the layer formed on the substrate 100 during the operation of the heater HT may be different from the layer formed on the substrate 100 in case that the coolant circulates through the flow path FP. For example, referring to FIG. 12, during the operation of the heater HT, the pixel circuit layer PCL may be formed on the substrate 100. Referring to FIG. 18, while the coolant circulates through the flow path FP, the input sensing portion 400 may be formed on the substrate 100.

In the embodiment, during the operation of the heater HT, the layer stacked on the substrate 100 may be different from the layer formed on the substrate 100 while the coolant circulates through the flow path FP. For example, during the operation of the heater HT, a buffer layer (not shown) may be stacked on the substrate 100. Referring to FIG. 18, while the coolant circulates through the flow path FP, the buffer layer, the pixel circuit layer PCL, the display layer DL, and the encapsulation layer 300 may be stacked on the substrate 100.

In the embodiment, the same susceptor 1330 may be used in the processing portion 1300. In case that the pixel circuit layer PCL is to be formed, the susceptor 1330 may be maintained at the first temperature T1 by using the heater HT, and in case that the input sensing portion 400 is to be formed, the susceptor 1330 may be maintained at the second temperature T2 that is lower than the first temperature T1, by using the coolant. Accordingly, in case that layers having different process temperatures are to be formed, the susceptor may not need to be replaced, and thus the efficiency of a method of manufacturing a display apparatus may be increased.

According to the above-described one or more embodiments, the efficiency of a method of manufacturing a display apparatus may be increased by using the susceptor satisfying various process conditions.

In detail, the susceptor may be commonly used in the operation of forming a pixel circuit layer and the operation of forming an input sensing portion.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a display apparatus, the method comprising:
    placing a display substrate on a susceptor in a chamber;
    maintaining the susceptor at a first temperature;
    removing the display substrate from the susceptor;
    dividing the display substrate into a plurality of partial substrates;
    placing the plurality of partial substrates on the susceptor; and
    maintaining the susceptor at a second temperature.

2. The method of claim 1, further comprising arranging a first mask frame in the chamber, the first mask frame including a first opening, wherein
    the first mask frame overlaps an edge of the display substrate, and
    the first opening exposes a central area of the display substrate.

3. The method of claim 1, further comprising forming a pixel circuit layer on the display substrate.

4. The method of claim 1, wherein the susceptor comprises a heater that maintains the susceptor at the first temperature.

5. The method of claim 1, further comprising arranging a second mask frame in the chamber, the second mask frame including a plurality of second openings, wherein
    the second mask frame overlaps edges of the plurality of partial substrates, and
    the plurality of second openings respectively expose central areas of the plurality of partial substrates.

6. The method of claim 1, wherein the maintaining of the susceptor at the second temperature comprises:
    introducing a coolant in the susceptor through a coolant input portion of the susceptor; and
    discharging the coolant from the susceptor through a coolant output portion of the susceptor.

7. The method of claim 1, further comprising forming an input sensing portion on each of the plurality of partial substrates.

8. The method of claim 1, wherein the first temperature is higher than the second temperature.

9. The method of claim 1, wherein
    the susceptor comprises:
        a plurality of holes; and
        a support plate that supports the display substrate or the plurality of partial substrates,
    the plurality of holes of the susceptor are formed in a first region and in a second region surrounded by the first region, and
    the first region is an edge of the support plate.

10. The method of claim 9, wherein the placing of the plurality of partial substrates on the susceptor comprises:
    placing the plurality of partial substrates on support pins that respectively pass through the plurality of holes; and
    placing the plurality of partial substrates on the support plate by moving either of the support pins and the susceptor with respect to the other of the support pins and the susceptor.

11. The method of claim 1, further comprising moving the susceptor upwards.

12. The method of claim 1, further comprising preventing deformation of the susceptor by using a deformation prevention part,
    wherein the susceptor includes the deformation prevention part.

13. A method of manufacturing a display apparatus comprising:
    placing a substrate on a susceptor which includes a flow path and a heater;
    operating the heater;
    circulating a coolant through the flow path;
    forming layers on the substrate by spraying a deposition material through a spray portion;
    forming a first layer on the substrate in conjunction with the operating of the heater; and
    forming a second layer on the substrate in conjunction with the circulating of the coolant through the flow path, wherein
    the forming of the layers includes at least one of forming a pixel circuit layer on the substrate and forming an input sensing portion on the substrate.

14. The method of claim 13, wherein the forming of the first layer comprises forming the pixel circuit layer on the substrate in conjunction with the operating of the heater.

15. The method of claim 13, further comprising maintaining the susceptor at a first temperature by using the heater.

16. The method of claim 13, wherein the forming of the second layer comprises forming the input sensing portion on the substrate in conjunction with the circulating of the coolant.

17. The method of claim 13, further comprising maintaining the susceptor at a second temperature by circulating the coolant through the flow path.

18. The method of claim 13, wherein
    the susceptor comprises a support plate that supports the substrate and includes a plurality of holes, and
    the plurality of holes are disposed in a first region and in a second region surrounded by the first region, wherein the first region is an edge of the support plate.

19. The method of claim 13, further comprising:
    arranging a mask frame including at least one opening in a chamber to face the susceptor;
    moving the susceptor upwards; and
    arranging the mask frame to overlap an edge of the substrate.

20. The method of claim 13, wherein
    the susceptor comprises a body part and a deformation prevention part, the body part surrounding the flow path and the heater, and
    the deformation prevention part prevents deformation of the body part.

* * * * *